(12) United States Patent
Iwamoto

(10) Patent No.: US 11,756,906 B2
(45) Date of Patent: Sep. 12, 2023

(54) ELECTRONIC MODULE AND METHOD OF MANUFACTURING ELECTRONIC MODULE

(71) Applicant: Murata Manufacturing Co., Ltd., Nagaokakyo (JP)

(72) Inventor: Takashi Iwamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 223 days.

(21) Appl. No.: 17/395,578

(22) Filed: Aug. 6, 2021

(65) Prior Publication Data

US 2021/0366849 A1 Nov. 25, 2021

Related U.S. Application Data

(63) Continuation of application No. PCT/JP2020/005161, filed on Feb. 10, 2020.

(30) Foreign Application Priority Data

Feb. 15, 2019 (JP) .................................. 2019-026074

(51) Int. Cl.
  *H01L 23/66* (2006.01)
  *H01L 21/48* (2006.01)
  (Continued)

(52) U.S. Cl.
  CPC ............ *H01L 23/66* (2013.01); *H01L 21/486* (2013.01); *H01L 21/4857* (2013.01);
  (Continued)

(58) Field of Classification Search
  CPC . H01L 25/043; H01L 25/0657; H01L 25/074; H01L 25/0756; H01L 25/117;
  (Continued)

(56) References Cited

U.S. PATENT DOCUMENTS

2010/0156546 A1 6/2010 Harima
2011/0278741 A1 11/2011 Chua et al.
(Continued)

FOREIGN PATENT DOCUMENTS

JP 2010-056842 A 3/2010
JP 2010-153941 A 7/2010
(Continued)

OTHER PUBLICATIONS

Official Communication issued in International Patent Application No. PCT/JP2020/005161, dated May 12, 2020.

*Primary Examiner* — Selim U Ahmed
*Assistant Examiner* — Evan G Clinton
(74) *Attorney, Agent, or Firm* — KEATING & BENNETT, LLP

(57) ABSTRACT

A high-frequency module includes a semiconductor element, a first insulating layer, an acoustic wave element, a second insulating layer, a first intermediate layer, and a second intermediate layer. The first intermediate layer is interposed between the acoustic wave element and the semiconductor element, and has a thermal conductivity lower than the first and second insulating layers. The second intermediate layer is interposed between the first insulating layer and the second insulating layer, and has a thermal conductivity lower than the first and second insulating layers. A step is provided between a first principal surface of the first insulating layer and one principal surface of the semiconductor element. The distance between first and second principal surfaces of the first insulating layer is greater than the distance between the second principal surface of the first insulating layer and the one principal surface of the semiconductor element.

20 Claims, 11 Drawing Sheets

(51) Int. Cl.
    *H01L 21/56*     (2006.01)
    *H01L 23/29*     (2006.01)
    *H01L 23/31*     (2006.01)
    *H01L 23/367*     (2006.01)
    *H01L 23/498*     (2006.01)
    *H01L 23/538*     (2006.01)
    *H01L 23/00*     (2006.01)
    *H01L 25/16*     (2023.01)

(52) U.S. Cl.
    CPC ............ *H01L 21/56* (2013.01); *H01L 23/295* (2013.01); *H01L 23/315* (2013.01); *H01L 23/367* (2013.01); *H01L 23/49816* (2013.01); *H01L 23/49822* (2013.01); *H01L 23/49844* (2013.01); *H01L 23/5383* (2013.01); *H01L 23/5386* (2013.01); *H01L 24/16* (2013.01); *H01L 24/24* (2013.01); *H01L 25/165* (2013.01); *H01L 2223/6616* (2013.01); *H01L 2224/16238* (2013.01); *H01L 2224/24137* (2013.01); *H01L 2924/1205* (2013.01); *H01L 2924/1206* (2013.01); *H01L 2924/14215* (2013.01)

(58) Field of Classification Search
    CPC ....... H01L 2225/06503–06596; H01L 23/315; H01L 21/4857; H01L 21/486; H01L 21/565; H01L 23/49822; H01L 23/49844; H01L 23/5383; H01L 23/5386; H01L 24/24; H01L 25/105; H01L 2224/24137; H01L 2224/24145; H01L 24/16; H01L 24/81; H01L 25/03; H01L 25/165; H01L 23/49816; H01L 2221/68345; H01L 2221/68359; H01L 2224/81801; H01L 21/6835; H01L 23/50; H01L 23/13; H01L 2224/16225; H01L 2924/181; H01L 2924/19105; H01L 21/56; H05K 3/46

See application file for complete search history.

(56) References Cited

U.S. PATENT DOCUMENTS

| | | | |
|---|---|---|---|
| 2013/0056867 A1* | 3/2013 | Pagaila | ................ H01L 21/565 257/737 |
| 2016/0338202 A1 | 11/2016 | Park et al. | |
| 2018/0053745 A1 | 2/2018 | Cheng et al. | |
| 2018/0316099 A1 | 11/2018 | Iwamoto | |
| 2020/0020677 A1* | 1/2020 | Chen | ....................... H01L 24/73 |
| 2020/0203309 A1* | 6/2020 | Beyne | ..................... H01L 24/94 |

FOREIGN PATENT DOCUMENTS

| | | |
|---|---|---|
| JP | 2016-213466 A | 12/2016 |
| WO | 2017/138299 A1 | 8/2017 |

\* cited by examiner

ELECTRONIC MODULE AND METHOD OF MANUFACTURING ELECTRONIC MODULE

CROSS REFERENCE TO RELATED APPLICATIONS

This application claims the benefit of priority to Japanese Patent Application No. 2019-026074 filed on Feb. 15, 2019 and is a Continuation Application of PCT Application No. PCT/JP2020/005161 filed on Feb. 10, 2020. The entire contents of each application are hereby incorporated herein by reference.

BACKGROUND OF THE INVENTION

1. Field of the Invention

The present invention relates to an electronic module and a method of manufacturing the electronic module, and more particularly, to an electronic module including an electronic element and a semiconductor element and a method of manufacturing the electronic module.

2. Description of the Related Art

There has hitherto been known, as an example of an electronic module, a high-frequency module including a surface acoustic wave filter (acoustic wave element) embedded in an insulating layer (first insulating layer) and an electronic component sealed by an insulating layer (second insulating layer) (see International Publication No. 2017/138299, for example).

In the high-frequency module described in International Publication No. 2017/138299, a portion of the surface acoustic wave filter is disposed so as to overlap the electronic component in plan view.

In International Publication No. 2017/138299, various filter devices, switches, chip inductors, chip capacitors, power amplifiers, integrated circuits (ICs), and the like are mentioned as the electronic component described above.

In the high-frequency module described in International Publication No. 2017/138299, when an electronic element, such as a surface acoustic wave filter having electrical characteristics, is disposed so as to overlap a semiconductor element, such as a power amplifier, in plan view, there is a possibility that the electrical characteristics of the electronic element deteriorate (vary) due to the effect of heat generated by the semiconductor element.

SUMMARY OF THE INVENTION

Preferred embodiments of the present invention provide electronic modules that are each capable of reducing or preventing deterioration in the electrical characteristics of an electronic element and methods of manufacturing such electronic modules.

A preferred embodiment of the present invention provides an electronic module including a semiconductor element, a first insulating layer, an electronic element, and a second insulating layer. The first insulating layer covers at least an outer peripheral surface of the semiconductor element. The first insulating layer includes a first principal surface and a second principal surface that face each other. The electronic element is electrically connected to the semiconductor element, and has electrical characteristics. The second insulating layer covers at least an outer peripheral surface of the electronic element. In the electronic module, at least a portion of the electronic element and at least a portion of the semiconductor element overlap each other in plan view in a thickness direction of the first insulating layer. The electronic module further includes a first intermediate layer and a second intermediate layer. The first intermediate layer is interposed between the electronic element and the semiconductor element. The first intermediate layer has a thermal conductivity that is lower than a thermal conductivity of the first insulating layer and a thermal conductivity of the second insulating layer. The second intermediate layer is interposed between the first insulating layer and the second insulating layer. The second intermediate layer has a thermal conductivity that is lower than the thermal conductivity of the first insulating layer and the thermal conductivity of the second insulating layer. In the electronic module, a step is provided between the first principal surface of the first insulating layer which is in contact with the second intermediate layer and one principal surface of the semiconductor element that is in contact with the first intermediate layer. In the electronic module, a distance between the second principal surface and the first principal surface of the first insulating layer is greater, in the thickness direction, than a distance between the second principal surface of the first insulating layer and the one principal surface of the semiconductor element.

A preferred embodiment of the present invention provides a method of manufacturing an electronic module including a temporary fixing material formation step, a semiconductor element arrangement step, a first insulating layer formation step, a removal step, an intermediate layer formation step, an electronic element arrangement step, and a second insulating layer formation step. In the temporary fixing material formation step, a temporary fixing material is formed on one principal surface of a support, a size of the temporary fixing material in plan view being smaller than a size of the one principal surface in plan view. In the semiconductor element arrangement step, a semiconductor element is disposed on the temporary fixing material with one principal surface of the semiconductor element facing the temporary fixing material. In the first insulating layer formation step, a first insulating layer is formed on a side of the one principal surface of the support, the first insulating layer covering at least an outer peripheral surface of the semiconductor element and including a first principal surface on a side of the one principal surface of the support and a second principal surface that faces the first principal surface. In the removal step, the support and the temporary fixing material are removed after the first insulating layer formation step. In the intermediate layer formation step, a first intermediate layer is formed on the one principal surface of the semiconductor element and a second intermediate layer is formed on the first principal surface of the first insulating layer after the removal step. In the electronic element arrangement step, an electronic element is disposed so as to overlap at least a portion of the first intermediate layer and at least a portion of the semiconductor element in a thickness direction of the semiconductor element after the intermediate layer formation step, the electronic element having electrical characteristics and being electrically connected to the semiconductor element. In the second insulating layer formation step, a second insulating layer that covers at least an outer peripheral surface of the electronic element is formed after the electronic element arrangement step. The temporary fixing material formation step includes forming the temporary fixing material to have a size corresponding to the one principal surface of the semiconductor element. The intermediate layer formation step includes forming both of the first intermediate layer and the second intermediate layer using a material with a thermal conductivity that is lower than both a thermal conductivity of the first insulating layer and a thermal conductivity of the second insulating layer.

With each of the electronic modules and the methods of manufacturing electronic modules according to preferred embodiments of the present invention, it is possible to reduce or prevent deterioration in the electrical characteristics of an electronic element.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
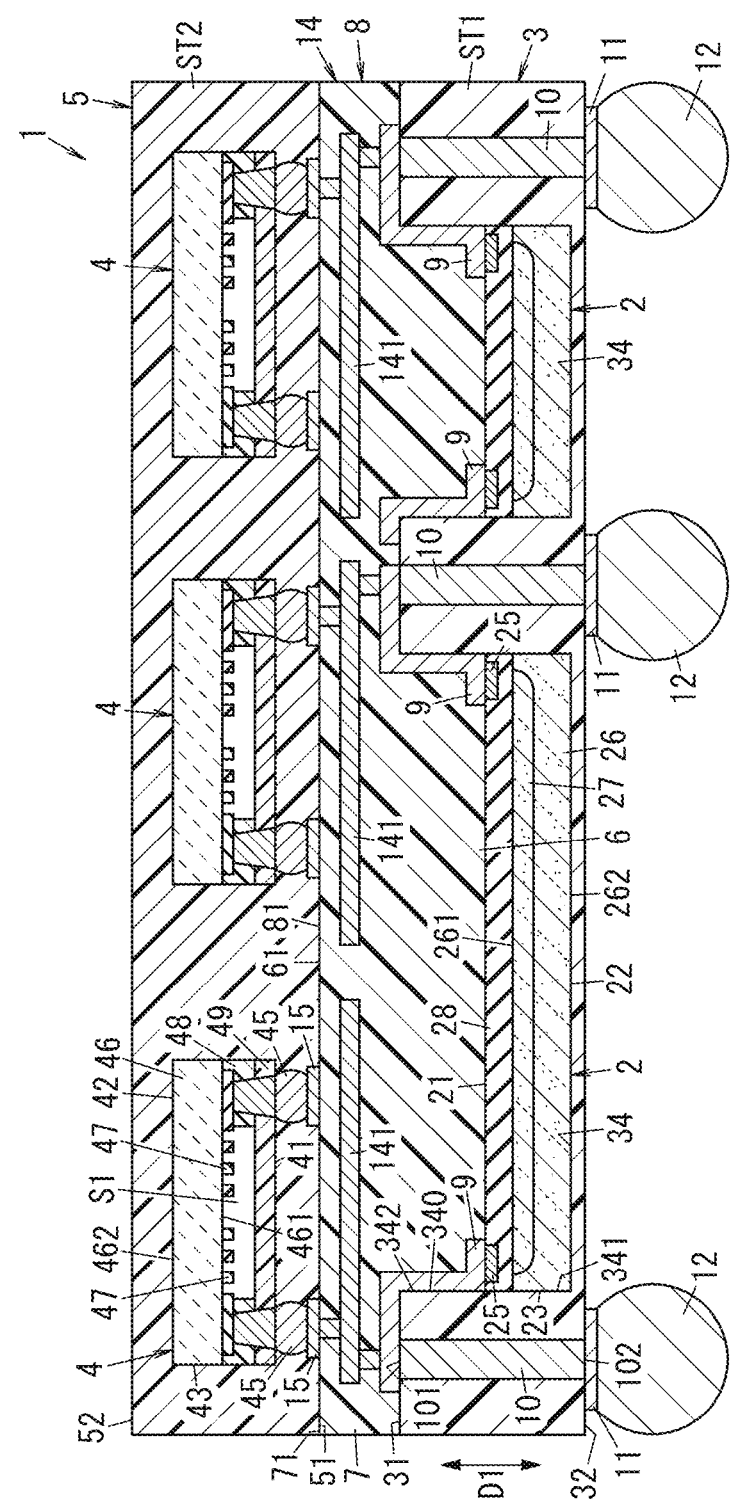
FIG. 1 is a sectional view of an electronic module according to Preferred Embodiment 1 of the present invention.

FIGS. 1 to 3, 4A to 4D, 5A to 5D, 6A to 6D, 7A to 7C, and 8 to 11 to be referenced in describing the following Preferred Embodiments 1 to 3 are each a schematic view, and the ratios of size and thickness between elements in the drawings do not necessarily reflect the actual dimensional ratios.

Preferred Embodiment 1

(1) Overall Configuration of Electronic Module

Figure 2:
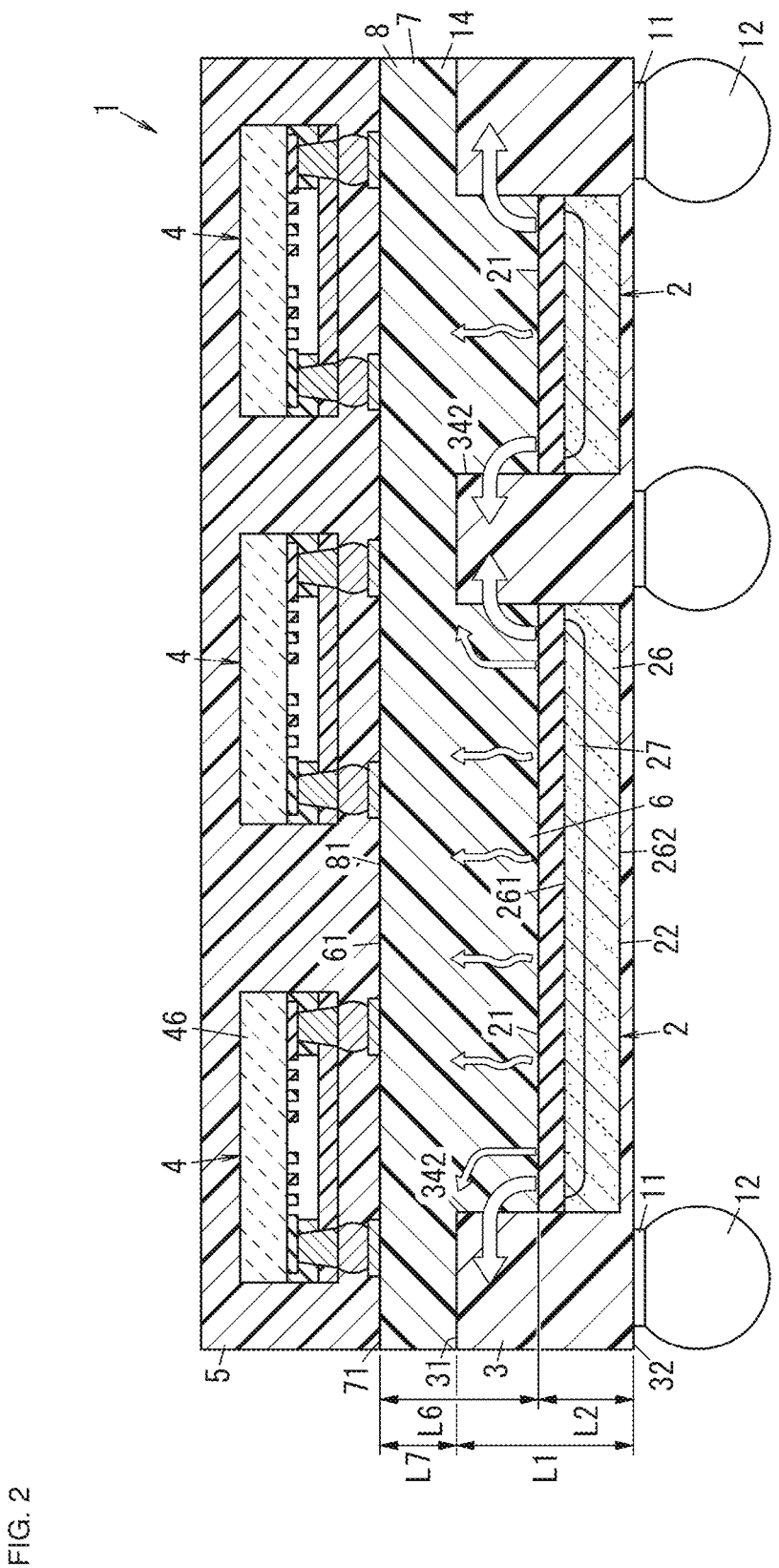
FIG. 2 illustrates a transmission path for heat generated by a semiconductor element in the electronic module of FIG. 1.

An electronic module according to Preferred Embodiment 1 of the present invention is a high-frequency module 1. As illustrated in FIGS. 1 and 2, the high-frequency module 1 according to Preferred Embodiment 1 includes a plurality of semiconductor elements 2, a first insulating layer 3, a plurality of acoustic wave elements (electronic elements) 4, and a second insulating layer 5. The first insulating layer 3 covers at least an outer peripheral surface 23 of each of the plurality of semiconductor elements 2. Each of the plurality of acoustic wave elements 4 is electrically connected to at least a corresponding one of the plurality of semiconductor elements 2. The second insulating layer 5 covers at least an outer peripheral surface 43 of each of the plurality of acoustic wave elements 4. In the high-frequency module 1, regarding a pair of a semiconductor element 2 and an acoustic wave element 4 electrically connected to each other, at least a portion of the acoustic wave element 4 and at least a portion of the semiconductor element 2 overlap each other in plan view in a thickness direction D1 of the first insulating layer 3. The high-frequency module 1 further includes a first intermediate layer 6 and a second intermediate layer 7. The first intermediate layer 6 is interposed between the acoustic wave elements 4 and the semiconductor elements 2 which overlap each other in the thickness direction D1 of the first insulating layer 3. The second intermediate layer 7 is interposed between the first insulating layer 3 and the second insulating layer 5.

The high-frequency module 1 also includes a plurality of metal wiring portions 9. The plurality of metal wiring portions 9 are directly connected to the semiconductor elements 2.

The high-frequency module 1 further includes a plurality of through electrodes 10. Each of the plurality of through electrodes 10 is electrically connected to a corresponding one of the plurality of metal wiring portions 9. The plurality of through electrodes 10 pass through the first insulating layer 3.

The high-frequency module 1 further includes a plurality of terminal electrodes 11. The plurality of terminal electrodes 11 are electrically connected to the plurality of through electrodes 10 in a one-to-one correspondence. The high-frequency module 1 further includes a plurality of bumps 12. The plurality of bumps 12 are connected to the plurality of terminal electrodes 11 in a one-to-one correspondence.

In the high-frequency module 1, each of the plurality of acoustic wave elements 4 includes a plurality of external connection electrodes 45.

The high-frequency module 1 according to Preferred Embodiment 1 includes a plurality of wiring portions 141 provided in an intermediate layer 8 that includes the first intermediate layer 6 and the second intermediate layer 7. In the high-frequency module 1 according to Preferred Embodiment 1, the intermediate layer 8 and the plurality of wiring portions 141 define a wiring structure 14. The high-frequency module 1 includes a plurality of mounting electrodes 15 provided on the wiring structure 14 for mounting of the plurality of acoustic wave elements 4. Each of the plurality of mounting electrodes 15 is electrically connected to at least either one of the plurality of through electrodes 10 or one of the plurality of metal wiring portions 9 via one of the plurality of wiring portions 141 of the wiring structure 14.

(2) Elements of High-Frequency Module

Next, elements of the high-frequency module 1 will be described with reference to the drawings.

(2.1) Semiconductor Element

The semiconductor element 2 is a semiconductor chip, for example. The semiconductor element 2 includes one principal surface 21 (hereinafter also referred to as a "first principal surface 21"), a second principal surface 22 opposite from the first principal surface 21 in the thickness direction of the semiconductor element 2, and the outer peripheral surface 23. The first principal surface 21 and the second principal surface 22 face each other. In the high-frequency module 1, the thickness direction of the semiconductor element 2 and the thickness direction D1 of the first insulating layer 3 are parallel or substantially parallel to each other. The outer peripheral shape of the semiconductor element 2 when seen in the thickness direction of the semiconductor element 2 is rectangular or substantially rectangular, for example. The outer peripheral surface 23 of the semiconductor element 2 includes four side surfaces that connect the first principal surface 21 on the side of the acoustic wave elements 4 and the second principal surface 22 which faces the first principal surface 21. The outer peripheral shape of the semiconductor element 2 is not limited to a rectangular or substantially rectangular shape and may be a square or substantially square shape, for example.

The semiconductor element 2 includes a functional portion 27 that generates heat. The semiconductor element 2 includes a semiconductor substrate 26 that includes one principal surface 261 and another principal surface 262, the functional portion 27, which is provided on the side of the one principal surface 261 of the semiconductor substrate 26, a multilayer structure 28 that includes a wiring layer and a passivation film, and a plurality of pad electrodes 25 electrically connected to the functional portion 27. The first principal surface 21 of the semiconductor element 2 includes a surface of the multilayer structure portion 28 and a surface of each of the plurality of pad electrodes 25. The second principal surface 22 of the semiconductor element 2 includes the other principal surface 262 of the semiconductor substrate 26.

The semiconductor element 2 is a power amplifier, for example. In the case where a power amplifier is used as the semiconductor element 2, the functional portion 27 of the semiconductor element 2 has an amplification function. In this case, the semiconductor substrate 26 may be a GaAs substrate, a Si substrate, an SOI (Silicon On Insulator) substrate, or the like, for example. The functional portion 27 includes a transistor such as an HBT (Heterojunction Bipolar Transistor), a FET (Field Effect Transistor), or the like, for example. The plurality of pad electrodes 25 include an input terminal and an output terminal. In this case, the semiconductor element 2 is a power amplifier that amplifies a signal input to the input terminal and that outputs the amplified signal from the output terminal. The semiconductor element 2 amplifies a signal input to the input terminal and outputs the amplified signal from the output terminal to a SAW filter that defines and functions as the acoustic wave element 4. The semiconductor element 2 is not limited to a power amplifier and may be a low-noise amplifier that amplifies a high-frequency signal from an antenna and that outputs the amplified high-frequency signal to a SAW (Surface Acoustic Wave) filter that defines and functions as the acoustic wave element 4, for example. Alternatively, the semiconductor element 2 may be an IC (Integrated Circuit), an MPU (Micro Processing Unit), an RF (Radio Frequency) switch, or the like, for example. In the case where an MPU is used as the semiconductor element 2, the functional portion 27 of the semiconductor element 2 has a logical function. In this case, the functional portion 27 includes a register, a computation circuit, a control circuit, and the like, for example.

(2.2) First Insulating Layer

The first insulating layer 3 is a resin structure body that holds the plurality of semiconductor elements 2. The first insulating layer 3 has a plate shape. The first insulating layer 3 has a first principal surface 31 and a second principal surface 32 opposite to the first principal surface 31. The first principal surface 31 and the second principal surface 32 face each other.

The outer peripheral shape of the first insulating layer 3 as seen in the thickness direction D1 of the first insulating layer 3 is rectangular or substantially rectangular, for example. However, the outer peripheral shape of the first insulating layer 3 is not limited thereto and may be square or substantially square, for example. The external size of the first insulating layer 3 as seen in the thickness direction D1 of the first insulating layer 3 is larger than the external size of the semiconductor element 2. That is, the area of the first insulating layer 3 in plan view in the thickness direction D1 is larger than the area of the semiconductor element 2 in plan view in the thickness direction D1.

The first insulating layer 3 includes a plurality of recessed portions 34, each of which accommodates the semiconductor element 2. The plurality of recessed portions 34 are recessed from the first principal surface 31 of the first insulating layer 3. The depth of each of the plurality of recessed portions 34 is larger than the thickness of the corresponding semiconductor element 2 (in other words, larger than the semiconductor element 2 accommodated in the recessed portion 34). The opening size of each of the recessed portions 34 in plan view in the thickness direction D1 of the first insulating layer 3 is the same or substantially the same as the external size of the corresponding semiconductor element 2. The first insulating layer 3 covers the outer peripheral surfaces 23 of the semiconductor elements 2 and the second principal surfaces 22 of the semiconductor elements 2. The first insulating layer 3 is in contact with the outer peripheral surfaces 23 and the second principal surfaces 22 of the semiconductor elements 2. The first insulating layer 3 holds the semiconductor elements 2 with the first principal surfaces 21 of the semiconductor elements 2 not covered. An inner peripheral surface 340 of each of the recessed portions 34 of the first insulating layer 3 includes a first inner peripheral surface 341 that is in contact with the outer peripheral surface 23 of the semiconductor element 2 and a second inner peripheral surface 342 located farther away from the second principal surface 32 of the first insulating layer 3 than the first inner peripheral surface 341.

The first insulating layer 3 has electrical insulation properties. The first insulating layer 3 includes a resin. In addition to the resin, the first insulating layer 3 includes a filler mixed with the resin, for example. The resin is an epoxy resin, for example. However, the resin is not limited to an epoxy resin and may be a polyamide resin, an acrylic resin, a urethane resin, or a silicone resin, for example. The material of the filler is silicon oxide, silicon nitride, aluminum oxide, boron nitride, aluminum nitride, diamond, carbon, or the like, for example. In addition to the resin and the filler, the first insulating layer 3 may also include a black pigment such as carbon black, for example.

(2.3) Acoustic Wave Element

The acoustic wave element 4 is an example of an electronic element that has electrical characteristics. The acoustic wave element 4 is a SAW filter, for example. In this case, the semiconductor element 2 electrically connected to the acoustic wave element 4 is a power amplifier that amplifies a signal that has passed through the SAW filter which serves as the acoustic wave element 4, for example. Alternatively, the acoustic wave element 4 may be, for example, a duplexer in which a SAW filter is used. The electronic module is not limited to the high-frequency module 1. Examples of the electronic element which has electrical characteristics include, in addition to the acoustic wave element 4, a power supply device for a high-frequency element, a sensor device (physical quantity sensor device) such as a magnetic sensor, an acceleration sensor, or a gyro sensor, and an infrared sensor device. The magnetic sensor, the acceleration sensor, the gyro sensor, and the like are sensor devices that use resonance of a structure body. Therefore, the electrical characteristics of such sensors may deteriorate when the temperature varies, since the state of resonance tends to vary significantly. The infrared sensor is a device that detects heat from outside based on whether the temperature of the sensor itself changes. Therefore, the electrical characteristics of the infrared sensor tend to deteriorate when the temperature varies. The electrical characteristics (specifically, the frequency characteristics) of the acoustic wave element and the power supply device for a high-frequency element tend to deteriorate when the temperature varies.

The acoustic wave element 4 includes one principal surface 41 (hereinafter also referred to as a "first principal surface 41") located on one side in the thickness direction, a second principal surface 42 opposite to the first principal surface 41 in the thickness direction, and the outer peripheral surface 43. The first principal surface 41 and the second principal surface 42 face each other. The outer peripheral shape of the acoustic wave element 4 when seen in the thickness direction of the acoustic wave element 4 is rectangular or substantially rectangular, for example. The outer peripheral surface 43 of the acoustic wave element 4 includes four side surfaces that connect the first principal surface 41 of the acoustic wave element 4 on the side of the semiconductor elements 2 and the second principal surface 42 which faces the first principal surface 41. The outer peripheral shape of the acoustic wave element 4 is not limited to a rectangular or substantially rectangular shape and may be a square or substantially square shape, for example.

The acoustic wave element 4 includes a piezoelectric substrate 46 and a plurality of IDT (Interdigital Transducer) electrodes 47, for example. In FIGS. 1 and 2, only two of the plurality of IDT electrodes 47 are illustrated schematically.

The piezoelectric substrate 46 has a rectangular or substantially rectangular shape in plan view in the thickness direction. However, the piezoelectric substrate 46 is not limited thereto and may have a square or substantially square shape, for example. The piezoelectric substrate 46 includes one principal surface 461 and another principal surface 462 opposite to each other in the thickness direction. The one principal surface 461 and the other principal surface 462 of the piezoelectric substrate 46 face each other. The piezoelectric substrate 46 is a lithium niobate ($LiNbO_3$) substrate, for example. However, the piezoelectric substrate 46 is not limited thereto and may be a lithium tantalate ($LiTaO_3$) substrate, a quartz substrate, or the like, for example. In the acoustic wave element 4, the plurality of IDT electrodes 47 are provided on the one principal surface 461 of the piezoelectric substrate 46. In the acoustic wave element 4, each of the plurality of IDT electrodes 47 defines a functional portion that generates heat. In the acoustic wave element 4, a plurality of surface acoustic wave resonators including respective ones of the plurality of IDT electrodes 47 are electrically connected to define a SAW filter.

The acoustic wave element 4 includes a spacer layer 48 and a cover member 49. The spacer layer 48 and the cover member 49 are provided on the side of the one principal surface 461 of the piezoelectric substrate 46.

The spacer layer 48 surrounds the plurality of IDT electrodes 47 in plan view in the thickness direction of the piezoelectric substrate 46. The spacer layer 48 has a frame shape (e.g., rectangular or substantially rectangular frame shape) in plan view in the thickness direction of the piezoelectric substrate 46. The spacer layer 48 has electrical insulation properties. The material of the spacer layer 48 is a synthetic resin such as an epoxy resin, polyimide, or the like, for example.

The cover member 49 has a flat plate shape. The cover member 49 has a rectangular or substantially rectangular shape in plan view in the thickness direction of the piezoelectric substrate 46, for example. However, the cover member 49 is not limited thereto and may have a square or substantially square shape, for example. In the acoustic wave element 4, the external size of the cover member 49, the external size of the spacer layer 48, and the external size of the piezoelectric substrate 46 are the same or substantially the same as each other in plan view in the thickness direction of the piezoelectric substrate 46. The cover member 49 is disposed on the spacer layer 48 so as to face the piezoelectric substrate 46 in the thickness direction of the piezoelectric substrate 46. The cover member 49 overlaps the plurality of IDT electrodes 47 in the thickness direction of the piezoelectric substrate 46 and is located away from the plurality of IDT electrodes 47 in the thickness direction of the piezoelectric substrate 46. The cover member 49 has electrical insulation properties. The material of the cover member 49 is a synthetic resin such as an epoxy resin, polyimide, or the like, for example.

The acoustic wave element 4 includes a space S1 surrounded by the piezoelectric substrate 46, the spacer layer 48, and the cover member 49. In the acoustic wave element 4, the space S1 accommodates a gas. The gas is air, an inert gas, (e.g., a nitrogen gas), or the like, for example.

The plurality of external connection electrodes 45 include an input terminal, an output terminal, and a ground terminal of the SAW filter. Each of the plurality of external connection electrodes 45 is a bump, for example. The bump is a solder bump, for example. The bump is not limited to a solder bump and may be a gold bump, for example.

In the acoustic wave element 4, a principal surface of the cover member 49 opposite from the side of the piezoelectric substrate 46 defines the first principal surface 41 of the acoustic wave element 4, and the other principal surface 462 of the piezoelectric substrate 46 defines the second principal surface 42 of the acoustic wave element 4. The outer peripheral surface 43 of the acoustic wave element 4 includes the outer peripheral surface of the piezoelectric substrate 46, the outer peripheral surface of the spacer layer 48, and the outer peripheral surface of the cover member 49. In the acoustic wave element 4, as discussed above, each of the plurality of IDT electrodes 47 on the one principal surface 461 of the piezoelectric substrate 46 defines the functional portion of the acoustic wave element 4.

The acoustic wave element 4 is disposed to at least partially overlap the semiconductor element 2 in plan view in the thickness direction D1 of the first insulating layer 3.

(2.4) Second Insulating Layer

The second insulating layer 5 is a sealing layer that seals the plurality of acoustic wave elements 4. The second insulating layer 5 covers the first principal surface 41, the second principal surface 42, and the outer peripheral surface 43 of the plurality of acoustic wave elements 4. The second insulating layer 5 has a rectangular or substantially rectangular shape in plan view in the thickness direction D1 of the first insulating layer 3, for example. However, the second insulating layer 5 is not limited thereto, and may have a square or substantially square shape, for example. The second insulating layer 5 has the same or substantially the same size as the size of the first insulating layer 3 in plan view in the thickness direction D1 of the first insulating layer 3. The second insulating layer 5 includes a first principal surface 51 on the side of the first insulating layer 3 and a second principal surface 52 opposite to the first principal surface 51. The first principal surface 51 and the second principal surface 52 face each other.

The second insulating layer 5 has electrical insulation properties. The second insulating layer 5 includes a resin. In addition to the resin, the second insulating layer 5 may also include a filler mixed with the resin, for example. The resin of the second insulating layer 5 is a polyimide resin, benzocyclobutene, polybenzoxazole, a phenol resin, a silicone resin, or the like, for example. The material of the filler is silicon oxide, silicon nitride, aluminum oxide, boron nitride, aluminum nitride, diamond, carbon, or the like, for example. In addition to the resin and the filler, the second insulating layer 5 may also contain a black pigment such as carbon black, for example. The material of the second insulating layer 5 may be the same as or different from the material of the first insulating layer 3.

(2.5) Metal Wiring Portion

Each of the plurality of metal wiring portions 9 is electrically connected to one of the plurality of semiconductor elements 2, and preferably directly connected as illustrated in FIG. 1. The metal wiring portion 9 is directly connected to the pad electrode 25 of the semiconductor element 2. The metal wiring portion 9 extends on the second inner peripheral surface 342 of the first insulating layer 3 on the side of the one principal surface 21 of the semiconductor element 2. The metal wiring portion 9 extends on the second inner peripheral surface 342 along the thickness direction D1 of the first insulating layer 3. The metal wiring portion 9 extends onto the first principal surface 31 of the first insulating layer 3. That is, the metal wiring portion 9 extends over the one principal surface 21 of the semiconductor element 2, the second inner peripheral surface 342 of the first insulating layer 3, and the first principal surface 31 of the first insulating layer 3. In the high-frequency module 1 according to Preferred Embodiment 1, the metal wiring portion 9 extends over the one principal surface 21 of the semiconductor element 2, the second inner peripheral surface 342 of the first insulating layer 3, the first principal surface 31 of the first insulating layer 3, and one end surface 101 of the through electrode 10. Consequently, the metal wiring portion 9 electrically connects the semiconductor element 2 and the through electrode 10.

The material of the metal wiring portion 9 is a metal layer, a metal alloy layer, or a stack thereof, for example. The metal layer is a copper layer or a stack of a copper layer and a titanium layer, for example. The material of the metal alloy layer is a material obtained by, for example, adding, to copper, at least one selected from the group consisting of chromium, nickel, iron, cobalt, and zinc, or a copper alloy, for example. The copper alloy is an alloy including copper and at least one selected from the group consisting of chromium, nickel, iron, cobalt, and zinc. The copper alloy is a copper-chromium alloy, a copper-nickel alloy, a copper-iron alloy, a copper-cobalt alloy, a copper-zinc alloy, or the like, for example.

(2.6) Through Electrode

The through electrode 10 is electrically connected to the metal wiring portion 9. The through electrodes 10 pass through the first insulating layer 3. The through electrode 10 is disposed at a side of the semiconductor element 2 which is electrically connected to the through electrode 10. The through electrode 10 is located away from the outer peripheral surface 23 of the semiconductor element 2. The through electrode 10 is located away from the inner peripheral surface 340 of the recessed portion 34 of the first insulating layer 3. The plurality of through electrodes 10 are located away from each other. The plurality of through electrodes 10 are held by the first insulating layer 3. In the high-frequency module 1, the position and the number of the through electrodes 10 are not specifically limited.

Each of the plurality of through electrodes 10 has a columnar shape (circular column shape). Each of the plurality of through electrodes 10 includes one end surface 101 (hereinafter also referred to as a "first end surface 101") and a second end surface 102 opposite to each other in a direction that is parallel or substantially parallel to the thickness direction D1 of the first insulating layer 3. A portion of a corresponding one of the plurality of metal wiring portions 9 overlaps the first end surface 101 of each of the plurality of through electrodes 10. In the high-frequency module 1, each of the plurality of through electrodes 10 is electrically connected to a corresponding one of the plurality of metal wiring portions 9.

The material of the through electrode 10 is metal, for example. The material of the through electrode 10 is copper or gold, for example.

(2.7) Terminal Electrode

The plurality of terminal electrodes 11 are electrically connected to the plurality of through electrodes 10 in a one-to-one correspondence. Each of the plurality of terminal electrodes 11 is provided on the second end surface 102 of a corresponding one of the plurality of through electrodes 10. Each of the plurality of terminal electrodes 11 is a UBM (Under Bump Metal), for example. Each of the terminal electrodes 11 has a stacked structure including a nickel layer on the second end surface 102 of the through electrode 10 and a gold layer on the nickel layer, for example.

(2.8) Bump

The plurality of bumps 12 are electrically connected to the plurality of terminal electrodes 11 in a one-to-one correspondence. Each of the plurality of bumps 12 is provided on a corresponding one of the plurality of terminal electrodes 11. The bump 12 is a solder bump, for example. The bump 12 is not limited to a solder bump, and may be a gold bump, for example. In the high-frequency module 1, each of the plurality of bumps 12 may be directly provided on the second end surface 102 of a corresponding one of the plurality of through electrodes 10.

(2.9) Mounting Electrode

The plurality of mounting electrodes 15 are provided on the wiring structure 14. Consequently, the plurality of mounting electrodes 15 are positioned away from the first principal surface 31 of the first insulating layer 3 and the first principal surface 21 of the semiconductor element 2 in the thickness direction D1 of the first insulating layer 3.

Each of the plurality of mounting electrodes 15 is a UBM (Under Bump Metal), for example. Each of the mounting electrodes 15 has a stacked structure including a nickel layer on the wiring structure 14 and a gold layer on the nickel layer, for example. The mounting electrodes 15 are not limited to having a stacked structure, and may have a single-layer structure.

(2.10) First Intermediate Layer and Second Intermediate Layer

The first intermediate layer 6 and the second intermediate layer 7 have electrical insulation properties. The intermediate layer 8 which includes the first intermediate layer 6 and the second intermediate layer 7 is interposed between a first structure body ST1 and a second structure body ST2. The first structure body ST1 includes the plurality of semiconductor elements 2 and the first insulating layer 3. The second structure body ST2 includes the plurality of acoustic wave elements 4 and the second insulating layer 5.

The first intermediate layer 6 is interposed between the acoustic wave elements 4 and the semiconductor elements 2 which overlap each other in the thickness direction D1 of the first insulating layer 3. The second intermediate layer 7 is interposed between the first principal surface 31 of the first insulating layer 3 and the first principal surface 51 of the second insulating layer 5.

In the high-frequency module 1 according to Preferred Embodiment 1, the material of the first intermediate layer 6 and the material of the second intermediate layer 7 are the same as each other. In the high-frequency module 1 according to Preferred Embodiment 1, the first intermediate layer 6 and the second intermediate layer 7 are integrally provided with each other.

The thermal conductivity of the first intermediate layer 6 and the thermal conductivity of the second intermediate layer 7 are lower than the thermal conductivity of the first insulating layer 3 and lower than the thermal conductivity of the second insulating layer 5.

The material of the first intermediate layer 6 and the second intermediate layer 7 is a resin, for example. The material of the first intermediate layer 6 and the second intermediate layer 7 is polyimide, benzocyclobutene, polybenzoxazole, a cyclic olefin resin, a phenol resin, a maleimide resin, or an epoxy resin, for example, and is preferably, for example, a fillerless resin including no filler from the viewpoint of reducing the thermal conductivity.

The material of the first intermediate layer 6 and the second intermediate layer 7 are not limited to a fillerless resin, and the first intermediate layer 6 and the second intermediate layer 7 may include a resin and a filler, for example. Even in the case where the first intermediate layer 6 and the second intermediate layer 7 include the same resin and the same filler as those of the first insulating layer 3, for example, the first intermediate layer 6 and the second intermediate layer 7 can each be a layer that has a lower thermal conductivity than the thermal conductivity of the first insulating layer 3 by reducing the content of the filler, for example. Even in the case where the first intermediate layer 6 and the second intermediate layer 7 include the same resin and the same filler as those of the second insulating layer 5, for example, the first intermediate layer 6 and the second intermediate layer 7 can each be a layer that has a lower thermal conductivity than the thermal conductivity of the second insulating layer 5 by reducing the content of the filler, for example.

In the high-frequency module 1 according to Preferred Embodiment 1, a principal surface 81 of the intermediate layer 8, which includes the first intermediate layer 6 and the second intermediate layer 7, on the side of the second insulating layer 5 has a planar shape. The principal surface 81 of the intermediate layer 8 includes a principal surface 61 of the first intermediate layer 6 on the side of the second insulating layer 5 and a principal surface 71 of the second intermediate layer 7 on the side of the second insulating layer 5.

(2.11) Wiring Structure

The wiring structure 14 is interposed between the plurality of mounting electrodes 15 and the plurality of semiconductor elements 2, the first insulating layer 3, and the plurality of metal wiring portions 9. The wiring structure 14 overlaps the first principal surface 31 of the first insulating layer 3, the first principal surface 21 of each of the plurality of semiconductor elements 2, and the plurality of metal wiring portions 9 in plan view in the thickness direction D1 of the first insulating layer 3.

The wiring structure 14 includes the plurality of wiring portions 141 corresponding to the plurality of mounting electrodes 15 and the intermediate layer 8 which serves as an insulating portion that electrically insulates the plurality of wiring portions 141 from each other. Each of the plurality of mounting electrodes 15 is provided on a corresponding one of the plurality of wiring portions 141, and electrically connected to a corresponding one of the plurality of metal wiring portions 9 or the like via the wiring portion 141.

The wiring structure 14 includes one wiring layer and two electrical insulating layers. The wiring layer is patterned into a predetermined pattern, and includes a plurality of conductor portions corresponding to respective ones of the plurality of wiring portions 141. The intermediate layer 8 in the wiring structure 14 includes a plurality of electrical insulating layers. The material of the wiring layer is copper, for example. However, the material of the wiring layer is not limited thereto. The material of the electrical insulating layers is the same as the material of the intermediate layer 8. The respective numbers of the wiring layer and the electrical insulating layers in the wiring structure 14 are not specifically limited, and may be one or more.

(3) Structure of High-frequency Module

In the high-frequency module 1, a step is provided between the first principal surface 31 of the first insulating layer 3, which is in contact with the second intermediate layer 7, and the one principal surface 21 of the semiconductor element 2, which is in contact with the first intermediate layer 6. In the high-frequency module 1, a distance L1 (see FIGS. 2 and 3) between the second principal surface 32 and the first principal surface 31 of the first insulating layer 3 is greater, in the thickness direction D1 of the first insulating layer 3, than a distance L2 (see FIGS. 2 and 3) between the second principal surface 32 of the first insulating layer 3 and the one principal surface 21 of the semiconductor element 2.

In the high-frequency module 1, a minimum distance L6 (see FIGS. 2 and 3) between the principal surfaces 21 of the semiconductor elements 2 and the principal surface 61 of the first intermediate layer 6 on the side of the acoustic wave elements 4 is greater than a minimum distance L7 (see FIGS. 2 and 3) between the first principal surface 31 of the first insulating layer 3 and the principal surface 71 of the second intermediate layer 7 on the side of the acoustic wave elements 4.

(4) Method of Manufacturing High-frequency Module

Next, a non-limiting example of a method of manufacturing the high-frequency module 1 according to Preferred Embodiment 1 will be described with reference to FIGS. 4A to 4D, 5A to 5D, 6A to 6D, and 7A to 7C.

In the method of manufacturing the high-frequency module 1, the following first to fifteenth steps are performed sequentially, for example.

Figure 4A:
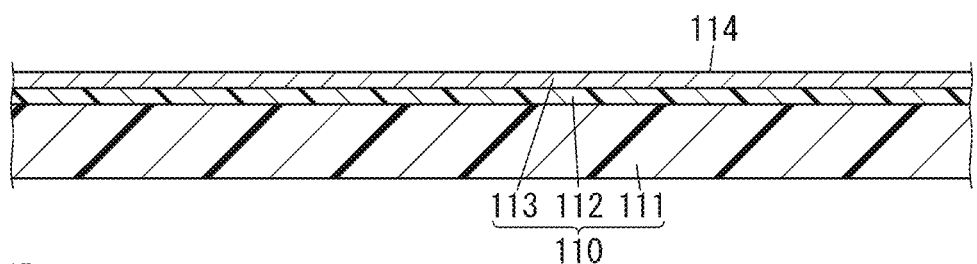
FIGS. 4A to 4D are each a sectional process view illustrating a method of manufacturing the electronic module in FIG. 1.

In the first step, as illustrated in FIG. 4A, a support member 110 is prepared. In the first step, a conductive layer 113 is provided above a support body 111 with an adhesive layer 112 interposed therebetween. That is, in the first step, the conductive layer 113 is indirectly provided above the support body 111. A principal surface of the conductive layer 113 opposite from the side of the support body 111 defines one principal surface 114 of the support member 110. The support member 110 includes the support body 111, the adhesive layer 112, and the conductive layer 113. The support body 111 is made from a glass epoxy material, for example. The adhesive layer 112 is made from an acrylic adhesive material, for example. The adhesive layer 112 is directly provided on the support body 111. The material of the conductive layer 113 is copper or nickel, for example. However, the material of the conductive layer 113 is not limited thereto, and may be an alloy including at least two selected from the group consisting of copper, chromium, nickel, iron, cobalt, zinc, palladium, and platinum, for example. The thickness of the conductive layer 113 is 20 μm, for example. The support body 111 is not limited to a glass epoxy material, and may be made from a PET film, a PEN film, a polyimide film, a metal plate, a ceramic substrate, or the like, for example. In the method of manufacturing the high-frequency module 1 according to Preferred Embodiment 1, the first step is a support member preparation step. In the support member preparation step, the support member 110 which includes the support body 111 and the conductive layer 113 which is indirectly provided above the support body 111 is prepared.

Figure 4B:
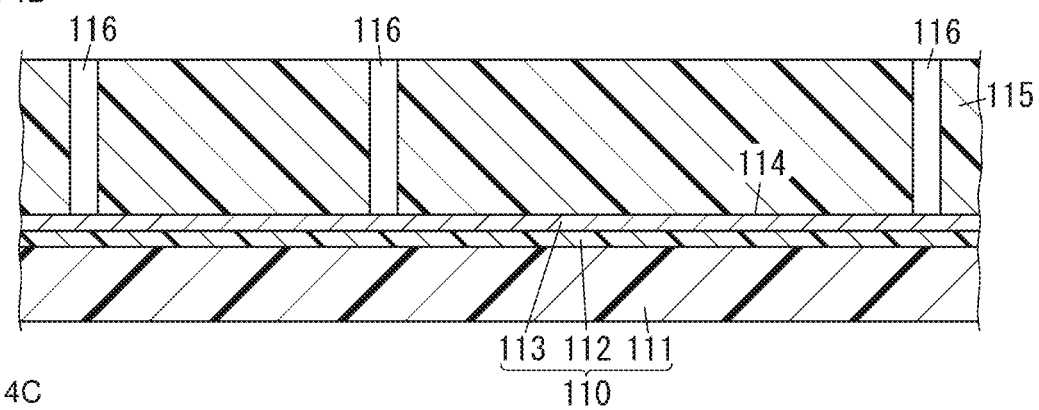

In the second step, as illustrated in FIG. 4B, a photoresist layer 115 that includes a plurality of opening portions 116 is formed on the one principal surface 114 of the support member 110. In the second step, the photoresist layer 115 which includes the plurality of opening portions 116 is formed using a photolithographic technique, for example. In the second step, the plurality of opening portions 116 are formed in the photoresist layer 115 in regions in which the plurality of conductor pillars 100 (see FIG. 4C), which make a one-to-one correspondence with the plurality of through electrodes 10, are to be formed. The plurality of opening portions 116 expose portions of the conductive layer 113 to define and function as the underlying portion for the conductor pillars 100. The plurality of through electrodes 10 are formed from the plurality of conductor pillars 100. Each of the plurality of conductor pillars 100 has a columnar shape (e.g., circular column shape).

Figure 4C:
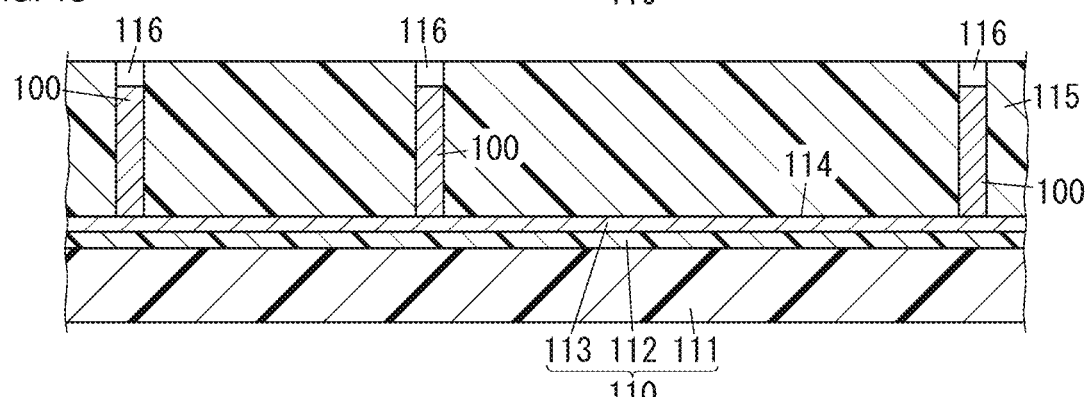

In the third step, as illustrated in FIG. 4C, a plurality of conductor pillars 100 are formed on the one principal surface 114 of the support member 110. In the third step, the plurality of conductor pillars 100 are formed by electroplating, for example. To form the plurality of conductor pillars 100, the plurality of conductor pillars 100 are deposited on the conductive layer 113 by applying a current between a positive electrode disposed to face the photoresist layer 115 with a plating solution including copper sulfate interposed therebetween and a negative electrode constituted from the conductive layer 113. The plating solution includes, in addition to the copper sulfate, a surface-active agent, a leveling agent, a plating brightener, an antifoaming agent, and the like, for example.

Figure 4D:
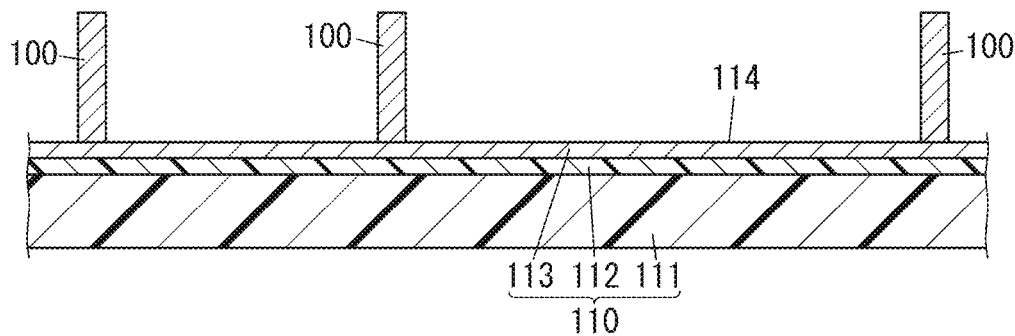

In the fourth step, as illustrated in FIG. 4D, the photoresist layer 115 is removed. In the fourth step, for example, the photoresist layer 115 is peeled using an organic solvent or the like, and thereafter a trace amount of residual matter, attached matter, or the like is removed using oxygen plasma.

Figure 5A:
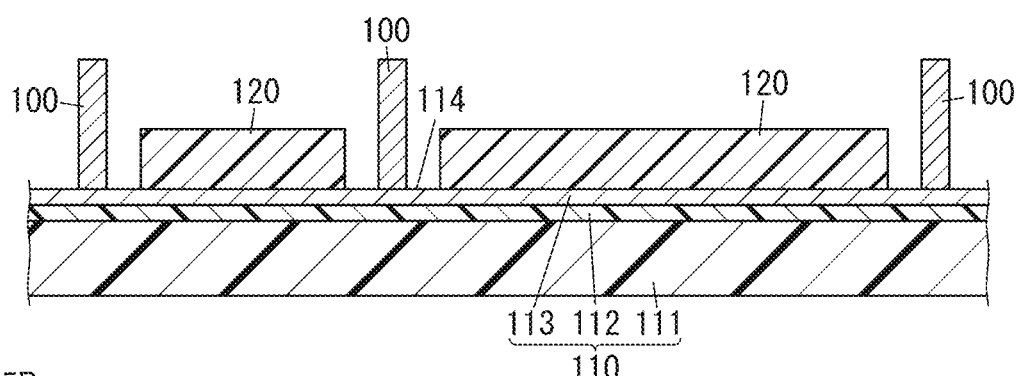
FIGS. 5A to 5D are each a sectional process view illustrating the method of manufacturing the electronic module in FIG. 1.

In the fifth step, as illustrated in FIG. 5A, a plurality of temporary fixing materials 120 are formed on the one principal surface 114 of the support member 110, the size of the temporary fixing materials 120 in plan view being smaller than that of the one principal surface 114 in plan view. The plurality of temporary fixing materials 120 are each a resin adhesive layer for temporarily fixing the plurality of semiconductor elements 2 which make a one-to-one correspondence with the temporary fixing materials 120. The size (external size in plan view) of each of the plurality of temporary fixing materials 120 is determined so as to be the same or substantially the same as the size (external size in plan view) of the corresponding semiconductor element 2 when the semiconductor element 2 is temporarily fixed, for example. The resin adhesive layer is formed from a positive-type resist that is photosensitive, for example. In the method of manufacturing the high-frequency module 1 according to Preferred Embodiment 1, the fifth step is a temporary fixing material formation step. In the temporary fixing material formation step, the temporary fixing materials 120 which are smaller than the one principal surface 114 of the support member 110 are formed on the one principal surface 114.

Figure 5B:
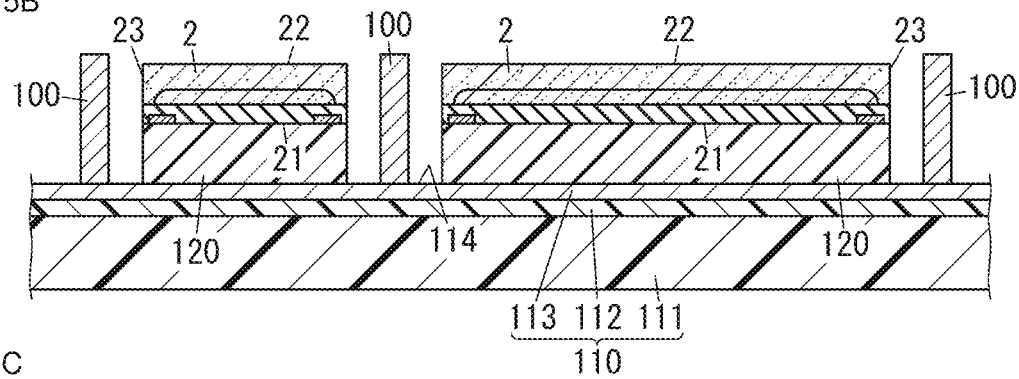

In the sixth step, as illustrated in FIG. 5B, corresponding ones of the plurality of semiconductor elements 2 are temporarily fixed onto the plurality of temporary fixing materials 120. In the sixth step, more particularly, the plurality of semiconductor elements 2 are temporarily fixed onto the one principal surface 114 of the support member 110 by disposing the semiconductor elements 2 on the temporary fixing materials 120 with the first principal surface 21 of each of the plurality of semiconductor elements 2 facing a corresponding one of the plurality of temporary fixing materials 120 which make a one-to-one correspondence. The step between the first principal surface 31 of the first insulating layer 3 and the first principal surfaces 21 of the semiconductor elements 2 in FIGS. 1 and 2 can be defined in accordance with the thickness of the temporary fixing materials 120 which are interposed between the one principal surface 114 of the support member 110 and the one principal surface 21 of the semiconductor element 2. The thickness of the temporary fixing materials 20 may be determined, as appropriate, in, for example, the range of about 5 μm or more and about 20 μm or less, and is about 10 μm, by way of example. In the method of manufacturing the high-frequency module 1 according to Preferred Embodiment 1, the sixth step is a semiconductor element arrangement step. In the semiconductor element arrangement step, the semiconductor elements 2 are disposed on the temporary fixing materials 120 with the one principal surface 21 of the semiconductor element 2 directed to the temporary fixing materials 120. In the sixth step, the plurality of semiconductor elements 2 do not necessarily make a one-to-one correspondence with the plurality of temporary fixing materials 120, and a plurality of semiconductor elements 2 may be temporarily fixed to one temporary fixing material 120.

Figure 5C:
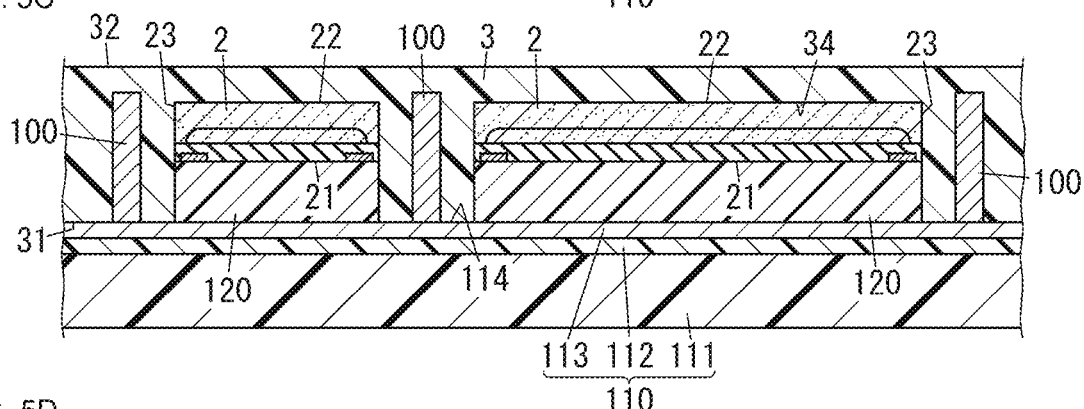

In the seventh step, as illustrated in FIG. 5C, a first insulating layer (resin structure body) 3 is formed on the one principal surface 114 of the support member 110. In the seventh step, the first insulating layer 3 is formed by press forming, for example. The method of forming the first insulating layer 3 is not limited to press forming. In the seventh process, the first insulating layer 3 may be formed using dispensing, printing, transfer molding, or the like, for example. In the seventh step, the first insulating layer 3 is formed so as to cover the one principal surface 114 of the support member 110, the plurality of conductor pillars 100, and the outer peripheral surface 23 and the second principal surface 22 of each of the plurality of semiconductor elements 2. Consequently, the recessed portions 34 are formed in the first insulating layer 3 in the seventh step.

In the non-limiting example method of manufacturing the high-frequency module 1 according to Preferred Embodiment 1, the seventh step is a first insulating layer formation step. In the first insulating layer formation step, the first insulating layer 3 is formed on the side of the one principal surface 114 of the support member 110, the first insulating layer 3 covering at least the outer peripheral surfaces 23 of the semiconductor elements 2 and having the first principal surface 31 on the side of the one principal surface 114 of the support member 110 and the second principal surface 32 which faces the first principal surface 31. In the method of manufacturing the high-frequency module 1 according to Preferred Embodiment 1, however, the thickness of the first insulating layer 3 which is formed in the seventh step is larger than the thickness of the first insulating layer 3 in the high-frequency module 1. Consequently, a portion of the first insulating layer 3 is interposed between the second principal surface 32 of the first insulating layer 3 which is formed in the seventh step and the conductor pillars 100.

Figure 5D:
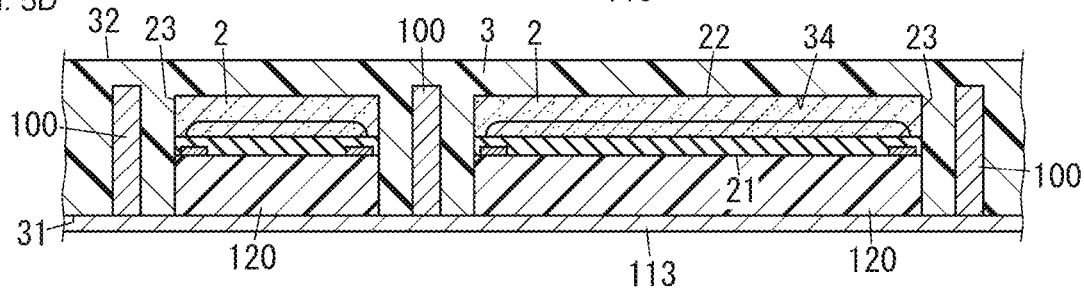

In the eighth step, as illustrated in FIG. 5D, the support body 111 and the adhesive layer 112 are removed from the structure body illustrated in FIG. 5C. Consequently, the conductive layer 113 is exposed in the eighth step. In the eighth step, the support body 111 is removed (peeled) by decreasing the adhesion of the adhesive layer 112, for example. The adhesive layer 112 is formed by an adhesive, the adhesion of which can be decreased by thermally forming the adhesive layer 112 or by applying ultraviolet light, for example.

Figure 6A:
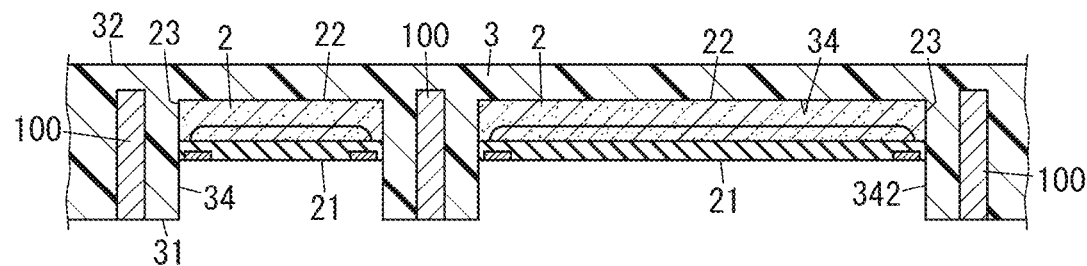
FIGS. 6A to 6D are each a sectional process view illustrating the method of manufacturing the electronic module in FIG. 1.

In the ninth step, as illustrated in FIG. 6A, the conductive layer 113 is removed from the structure body in FIG. 5D, and further the plurality of temporary fixing materials 120 are removed. In the ninth step, the conductive layer 113 is removed by etching, for example. In the ninth step, in addition, the temporary fixing materials 120 are removed by exposing the temporary fixing materials 120 to light and thereafter developing the temporary fixing materials 120, for example. Consequently, a step corresponding to the thickness of the temporary fixing materials 120 is formed between the first principal surface 31 of the first insulating layer 3 and the first principal surfaces 21 of the semiconductor elements 2. In the method of manufacturing the high-frequency module 1 according to Preferred Embodiment 1, the eighth step and the ninth step define a removal step in which the support member 110 and the temporary fixing materials 120 are removed after the first insulating layer formation step.

Figure 6B:
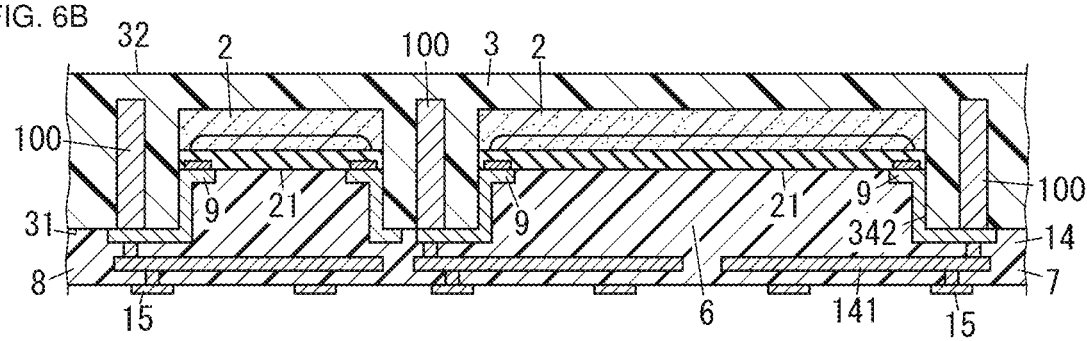

In the tenth step, as illustrated in FIG. 6B, a plurality of metal wiring portions 9, a wiring structure 14 including a first intermediate layer 6 and a second intermediate layer 7, and a plurality of mounting electrodes 15 are formed on the side of the first principal surface 31 of the first insulating layer 3 and on the side of the first principal surfaces 21 of the semiconductor elements 2. To form the metal wiring portions 9 in the tenth step, the metal wiring portions 9 are each formed so as to extend over the pad electrode 25 of the corresponding semiconductor element 2, the second inner peripheral surface 342 of the recessed portion 34 which accommodates the semiconductor element 2, the first principal surface 31 of the first insulating layer 3, and an end surface of the corresponding conductor pillar 100. To form the intermediate layer 8, which includes the first intermediate layer 6 and the second intermediate layer 7, in the wiring structure 14 in the tenth step, a patterned electrical insulating layer is formed using a photolithographic technique, for example. To form the plurality of wiring portions 141 in the wiring structure 14, a patterned wiring layer is formed using a photolithographic technique and an etching technique, for example. To form the plurality of mounting electrodes 15, a plurality of patterned mounting electrodes 15 are formed using a photolithographic technique and an etching technique, for example. In the method of manufacturing the high-frequency module 1 according to Preferred Embodiment 1, the step of forming the intermediate layer 8 in the tenth step constitutes an intermediate layer formation step. In the intermediate layer formation step, the first intermediate layer 6 is formed on the one principal surface 21 of the semiconductor element 2 after the removal step, and the second intermediate layer 7 is formed on the first principal surface 31 of the first insulating layer 3.

Figure 6C:
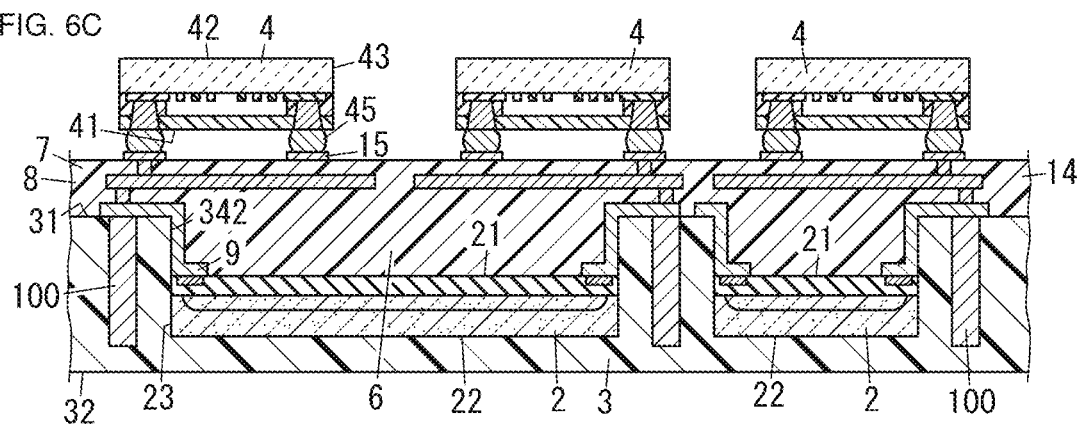

In the eleventh step, as illustrated in FIG. 6C, a plurality of acoustic wave elements 4 (electronic elements) are mounted on the structure body illustrated in FIG. 6B. In the eleventh step, a plurality of external connection electrodes 45 of the acoustic wave elements 4 are disposed on corresponding ones of the plurality of mounting electrodes 15, and electrically and mechanically connected to the mounting electrodes 15. In the method of manufacturing the high-frequency module 1 according to Preferred Embodiment 1, the eleventh step is an electronic element arrangement step. In the electronic element arrangement step, the acoustic wave elements 4 to be electrically connected to the semiconductor elements 2 are disposed so as to overlap at least a portion of the first intermediate layer 6 and at least a portion of the semiconductor elements 2 in the thickness direction of the semiconductor elements 2 after the intermediate layer formation step.

Figure 6D:
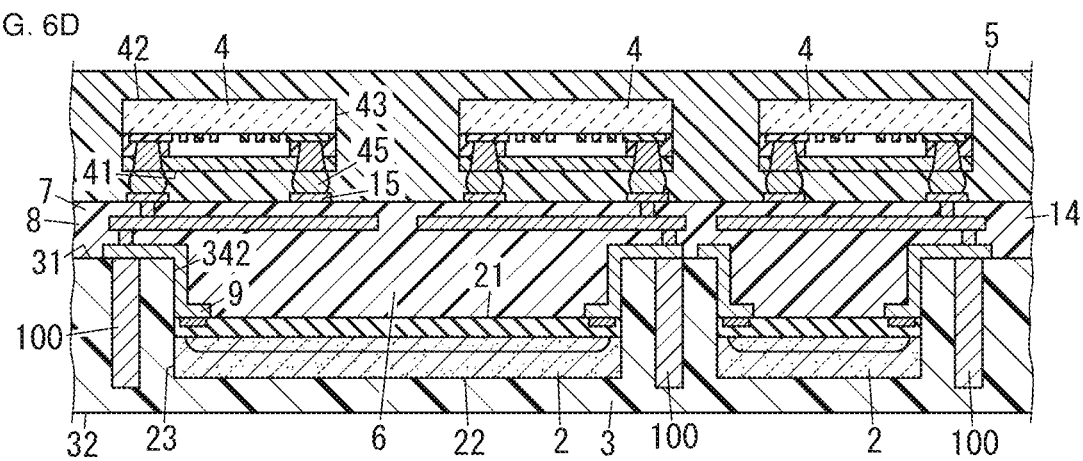

In the twelfth step, as illustrated in FIG. 6D, a second insulating layer 5 that covers the plurality of acoustic wave elements 4 is formed. In the twelfth step, the second insulating layer 5 is formed so as to cover at least the outer peripheral surface 43 of each of the plurality of acoustic wave elements 4. In the method of manufacturing the high-frequency module 1 according to Preferred Embodiment 1, the second insulating layer 5 is formed so as to cover the outer peripheral surface 43, the second principal surface 42, and the first principal surface 41 of each of the plurality of acoustic wave elements 4 in the twelfth step. In the twelfth step, the plurality of acoustic wave elements 4 are sealed by the second insulating layer 5. In the method of manufacturing the high-frequency module 1 according to Preferred Embodiment 1, the twelfth step is a second insulating layer formation step. In the second insulating layer formation step, the second insulating layer 5 which covers at least the outer peripheral surfaces 43 of the acoustic wave elements 4 is formed after the electronic element arrangement step.

Figure 7A:
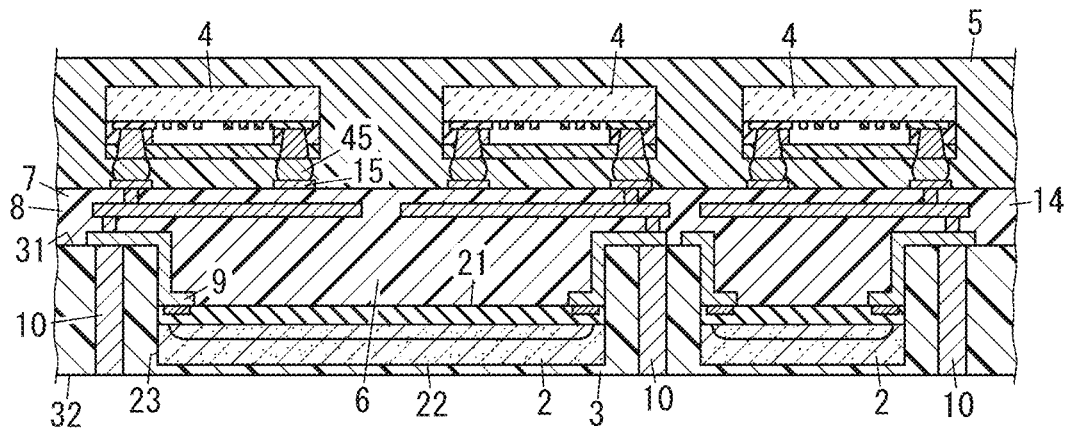
FIGS. 7A to 7C are each a sectional process view illustrating the method of manufacturing the electronic module in FIG. 1.

In the thirteenth step, as illustrated in FIG. 7A, the first insulating layer 3 is polished from the side of the second principal surface 32 of the first insulating layer 3 to a predetermined thickness of the first insulating layer 3. In the thirteenth step, the first insulating layer 3 is polished so as to expose the distal end surfaces of the conductor pillars 100 and make the second principal surface 32 of the first insulating layer 3 flush or substantially flush with the distal end surfaces of the conductor pillars 100. In the thirteenth step, the distal end surfaces of the conductor pillars 100 should be exposed, and it is not necessary that the distal end surfaces of the conductor pillars 100 and the second principal surface 32 of the first insulating layer 3 should be flush with each other. By performing the thirteenth step, a plurality of through electrodes 10 are formed from corresponding ones of the plurality of conductor pillars 100.

Figure 7B:
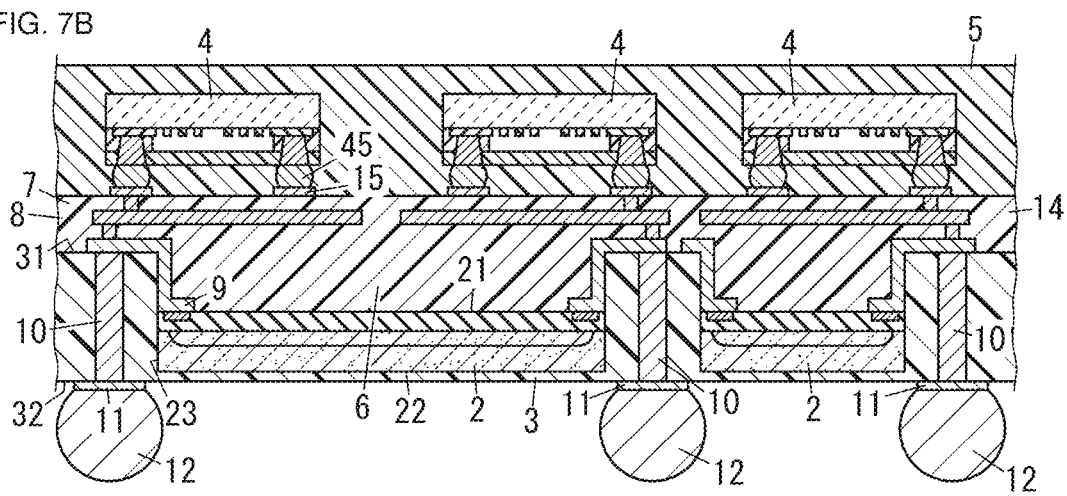

In the fourteenth step, as illustrated in FIG. 7B, a plurality of terminal electrodes 11 and a plurality of bumps 12 are formed. In the fourteenth step, the plurality of terminal electrodes 11 are formed using sputtering or plating, a photolithographic technique, and an etching technique, for example.

In the non-limiting example method of manufacturing the high-frequency module 1 according to Preferred Embodiment 1, a support member 110 having a size that enables formation of an aggregation of a plurality of high-frequency modules 1 is used as the support member 110 in the first step, and a structure body, from which a plurality of high-frequency modules 1 are formed, can be formed by performing the first to fourteenth steps.

Figure 7C:
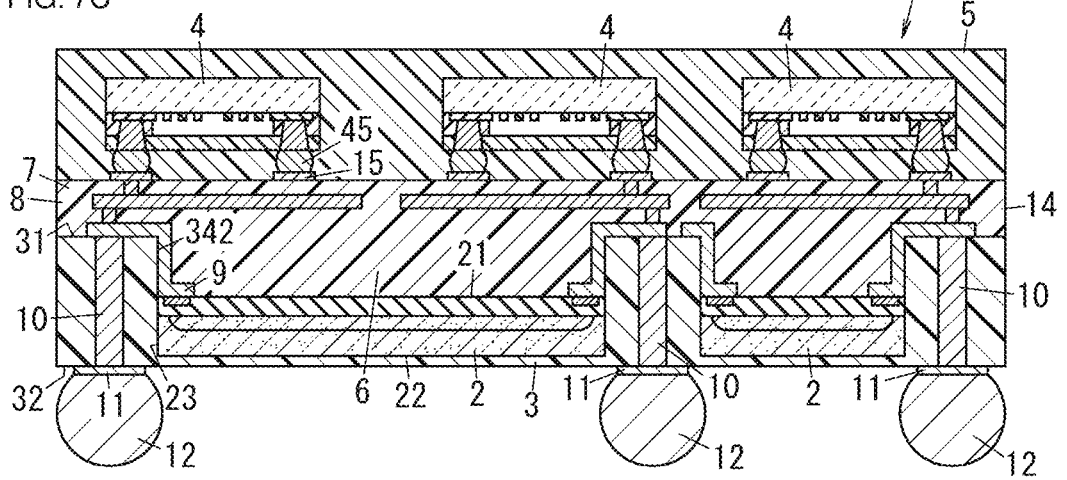

In the fifteenth step, as illustrated in FIG. 7C, the structure body (see FIG. 7B), from which a plurality of high-frequency modules 1 are to be formed, is divided into individual high-frequency modules 1. The fifteenth step is a dicing step. Consequently, the plurality of high-frequency modules 1 are obtained in the fifteenth step. In the fifteenth step, dicing is performed using a dicing blade, for example. However, the present invention is not limited thereto, and dicing may be performed using laser, for example.

(Effect)

In the high-frequency module 1 according to Preferred Embodiment 1, a step is provided between the first principal surface 31 of the first insulating layer 3, which is in contact with the second intermediate layer 7, and the one principal surface 21 of the semiconductor element 2, which is in contact with the first intermediate layer 6, and the distance L1 between the second principal surface 32 and the first principal surface 31 of the first insulating layer 3 is greater, in the thickness direction D1 of the first insulating layer 3, than the distance L2 between the second principal surface 32 of the first insulating layer 3 and the principal surfaces 21 of the semiconductor elements 2. Consequently, in the high-frequency module 1 according to Preferred Embodiment 1, it is possible for heat generated by the semiconductor elements 2 not to be conducted easily to the acoustic wave elements 4, which makes it possible to reduce or prevent deterioration (variations) in the electric characteristics (e.g., the frequency characteristics etc.) of the acoustic wave elements 4.

Figure 3:
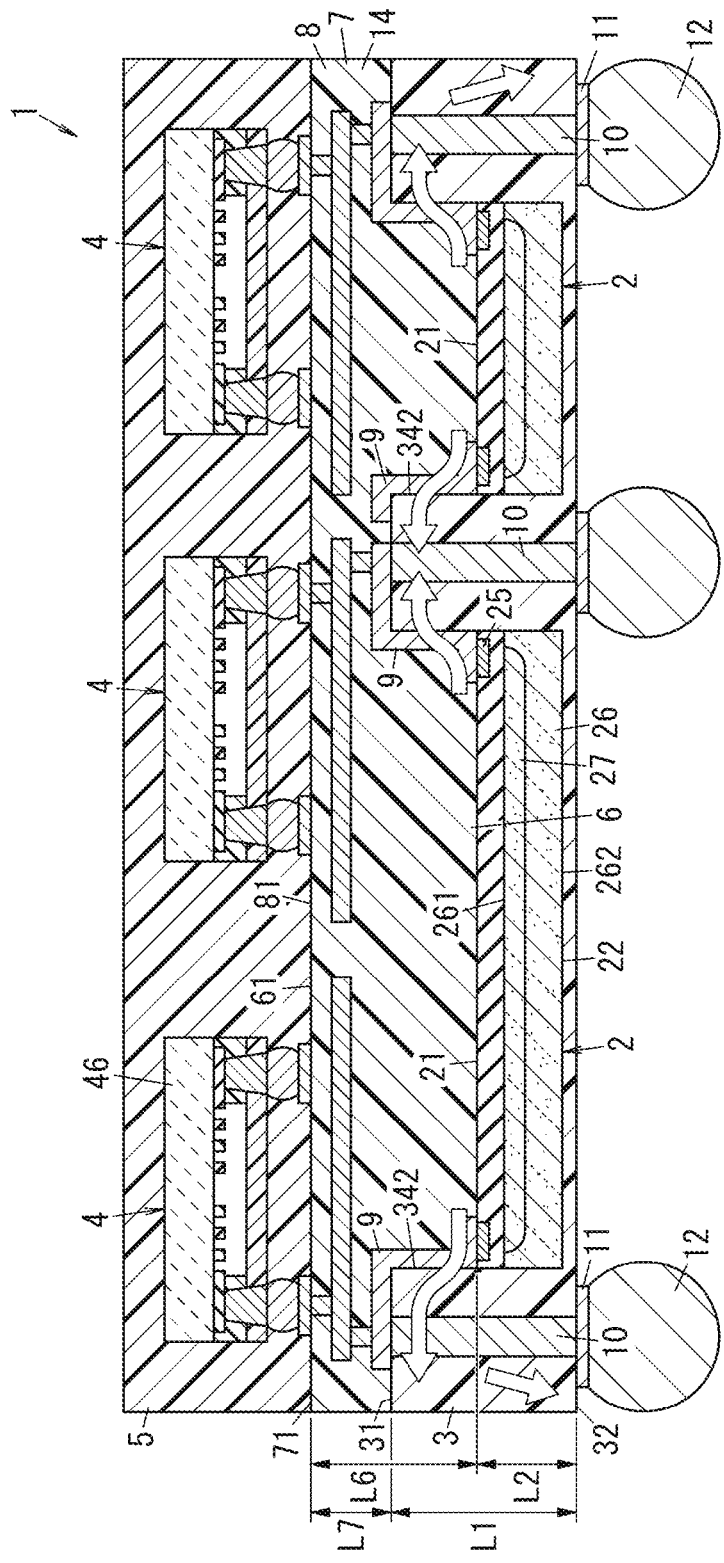
FIG. 3 illustrates a transmission path for heat generated by the semiconductor element in the electronic module of FIG. 1.

FIGS. 2 and 3 illustrate transmission paths for a portion of heat generated by the semiconductor elements 2. FIGS. 2 and 3 are views of one high-frequency module 1 as seen in different sections. In FIGS. 2 and 3, the transmission paths for a portion of the heat are schematically indicated by outlined arrows. The heat generated by the semiconductor elements 2 is generated by the functional portions 27. In the high-frequency module 1, there is a step between the first principal surface 31 of the first insulating layer 3 which is in contact with the second intermediate layer 7 and the principal surfaces 21 of the semiconductor elements 2 which is in contact with the first intermediate layer 6. Thus, heat emitted from the first principal surfaces 21 of the semiconductor elements 2 to enter the first intermediate layer 6 to be directed to the side of the acoustic wave elements 4, of the heat generated by the semiconductor elements 2, can easily escape to the first insulating layer 3 through the second inner peripheral surface 342 of the first insulating layer 3. As a result, in the high-frequency module 1 according to Preferred Embodiment 1, heat conducted from the semiconductor elements 2 to the acoustic wave elements 4 is decreased, which reduces or prevents thermal expansion of the piezoelectric substrates 46 of the acoustic wave elements 4 and makes it possible for the frequency characteristics of the acoustic wave elements 4 not to be easily deteriorated.

In the case where it is attempted to reduce or prevent the effect of heat generated by the semiconductor elements on the acoustic wave elements by increasing the distance between the semiconductor elements and the acoustic wave elements in the high-frequency module described in International Publication No. 2017/138299, it is difficult to reduce the height of the high-frequency module. With the high-frequency module 1 according to Preferred Embodiment 1, on the contrary, it is possible to reduce or prevent the effect of heat generated by the semiconductor elements 2 on the acoustic wave elements 4 while reducing the height of the high-frequency module 1.

In the case where it is attempted to reduce or prevent the effect of heat generated by the semiconductor elements on the acoustic wave elements by reducing the thermal conductivity of each of the first insulating layer and second insulating layer in the high-frequency module described in International Publication No. 2017/138299, the ratio of heat that reaches the side of the acoustic wave elements, of the heat generated by the semiconductor elements, is not significantly reduced, and heat is trapped in the semiconductor elements to easily raise the temperature of the semiconductor elements. With the high-frequency module 1 according to Preferred Embodiment 1, on the contrary, it is possible to reduce or prevent the effect of heat generated by the semiconductor elements 2 on the acoustic wave elements 4, and reduce or prevent a rise in the temperature of the semiconductor elements 2.

In the non-limiting example method of manufacturing the high-frequency module 1 according to Preferred Embodiment 1, it is possible to provide a high-frequency module 1 capable of reducing or preventing deterioration in the electrical characteristics (e.g., frequency characteristics, etc.) of the acoustic wave elements 4.

The high-frequency module 1 further includes the metal wiring portions 9 which are directly connected to the semiconductor elements 2. The metal wiring portions 9 extend on the second inner peripheral surface 342 of the first insulating layer 3 on the side of the one principal surface 21 of the semiconductor element 2. Consequently, in the high-frequency module 1, as illustrated in FIG. 3, heat generated by the semiconductor elements 2 is easily transferred to the metal wiring portions 9, and it is possible for the heat not to be conducted easily to the acoustic wave elements 4, and the effect of further reducing or preventing a rise in the temperature of the acoustic wave elements 4 can be obtained. In the case where the metal wiring portions 9 extend onto the first principal surface 31 of the first insulating layer 3, the above advantageous effect is more easily obtained.

The high-frequency module 1 according to Preferred Embodiment 1 further includes the through electrodes 10 which are electrically connected to the metal wiring portions 9 and which pass through the first insulating layer 3. Consequently, in the high-frequency module 1, heat generated by the semiconductor elements 2 is easily transferred to the through electrodes 10, and it is possible for the heat not to be conducted easily to the acoustic wave elements 4, and the advantageous effect of further reducing or preventing a rise in the temperature of the acoustic wave elements 4 can be obtained.

Modification 1 of Preferred Embodiment 1

Figure 8:
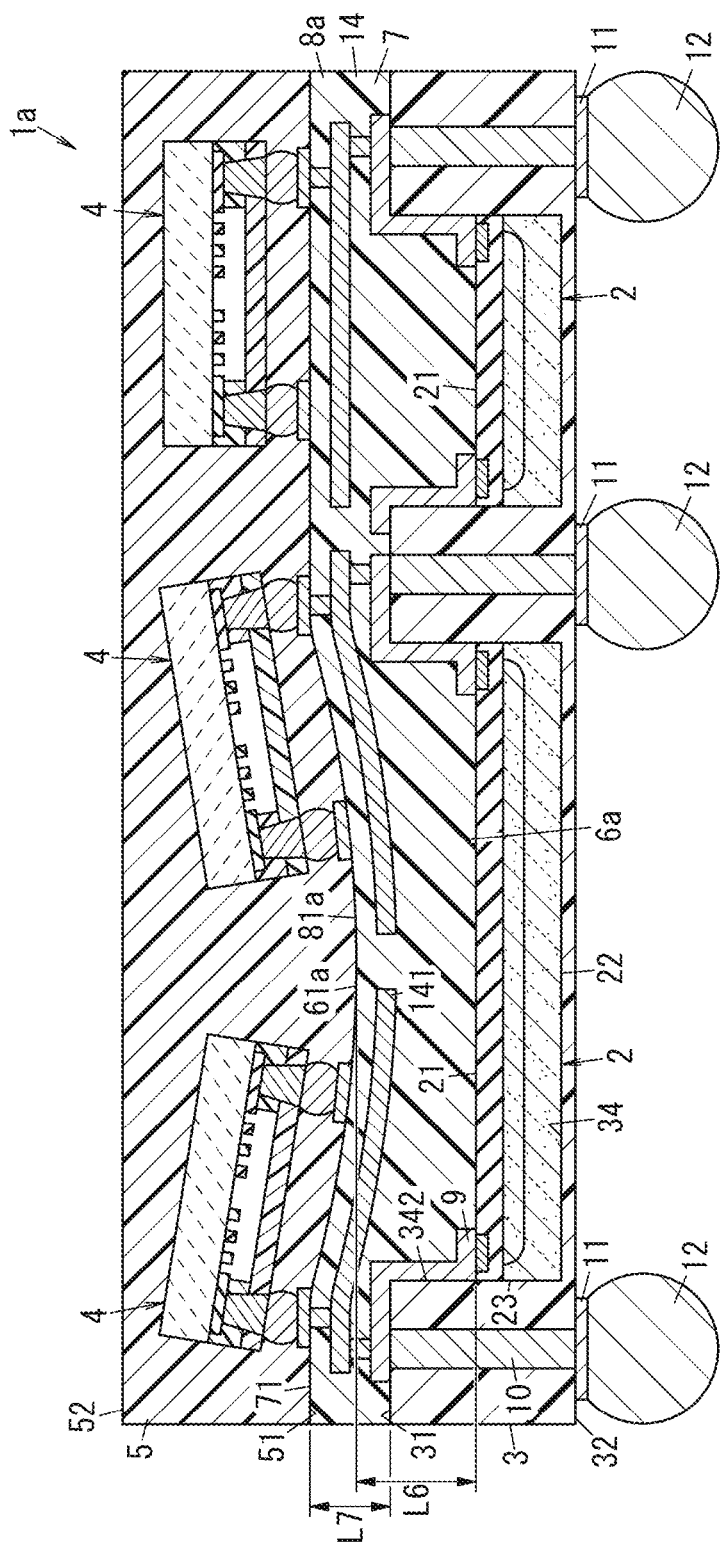
FIG. 8 is a sectional view of an electronic module according to Modification 1 of Preferred Embodiment 1 of the present invention.

An electronic module (high-frequency module 1a) according to Modification 1 of Preferred Embodiment 1 of the present invention will be described below with reference to FIG. 8.

The high-frequency module 1a according to Modification 1 differs from the high-frequency module 1 according to Preferred Embodiment 1 in that it includes a first intermediate layer 6a in place of the first intermediate layer 6 of the high-frequency module 1 according to Preferred Embodiment 1. Elements of the high-frequency module 1a according to Modification 1 that are the same or substantially the same as those of the high-frequency module 1 according to Preferred Embodiment 1 are denoted by the same reference numerals and description thereof is omitted.

In the high-frequency module 1a according to Modification 1, a principal surface 61a of the first intermediate layer 6a is recessed with respect to the principal surface 71 of the second intermediate layer 7 in a principal surface 81a of an intermediate layer 8a because of a step between the first principal surface 31 of the first insulating layer 3 and the first principal surfaces 21 of the semiconductor elements 2. The intermediate layer 8a includes the first intermediate layer 6a and the second intermediate layer 7. The material of the first intermediate layer 6a is the same as the material of the first intermediate layer 6 of the high-frequency module 1 according to Preferred Embodiment 1.

In the high-frequency module 1a according to Modification 1, the minimum distance L6 between the principal surfaces 21 of the semiconductor elements 2 and the principal surface 61a of the first intermediate layer 6a on the side of the acoustic wave elements 4 is greater than the minimum distance L7 between the first principal surface 31 of the first insulating layer 3 and the principal surface 71 of the second intermediate layer 7 on the side of the acoustic wave elements 4. Consequently, in the high-frequency module 1a according to Modification 1, as in the high-frequency module 1 according to Preferred Embodiment 1, it is further possible for heat generated by the semiconductor elements 2 not to be conducted easily to the acoustic wave elements 4, which makes it possible to further reduce or prevent deterioration in the electrical characteristics of the acoustic wave elements 4.

Modification 2 of Preferred Embodiment 1

Figure 9:
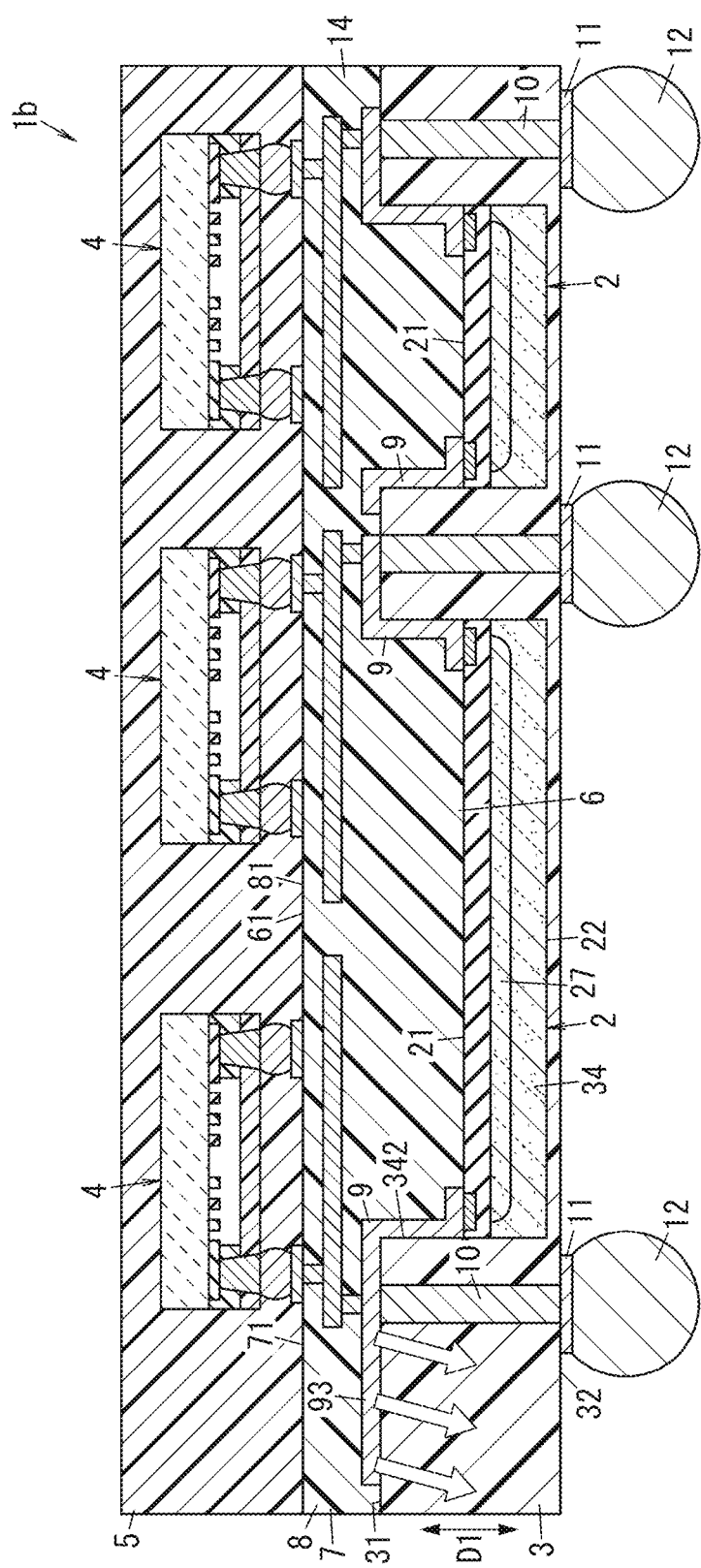
FIG. 9 is a sectional view of an electronic module according to Modification 2 of Preferred Embodiment 1 of the present invention.

An electronic module (high-frequency module 1b) according to Modification 2 of Preferred Embodiment 1 of the present invention will be described below with reference to FIG. 9.

The high-frequency module 1b according to Modification 2 differs from the high-frequency module 1 according to Preferred Embodiment 1 in that it includes a metal portion 93 extending from a portion of the metal wiring portion 9 overlapping the through electrode 10 toward the side opposite from the side of the semiconductor element 2 in plan view in the thickness direction D1 of the first insulating layer 3.

In the high-frequency module 1 according to Preferred Embodiment 1, the metal wiring portion 9 extends to a region overlapping the bump 12 in the thickness direction D1 of the first insulating layer 3. In the high-frequency module 1b according to Modification 2, on the contrary, the metal portion 93 is further extended onto a region not overlapping the bump 12 in the thickness direction D1 of the first insulating layer 3. The shape of the metal portion 93 in plan view in the thickness direction D1 of the first insulating layer 3 is a linear shape, for example. However, the shape of the metal portion 93 is not limited to a linear shape.

In the high-frequency module 1b according to Modification 2 which includes the metal portion 93, in comparison with the high-frequency module 1 according to Preferred Embodiment 1, it is possible for heat generated by the semiconductor elements 2 not to be conducted easily to the acoustic wave elements 4, which makes it possible to reduce or prevent deterioration in the electrical characteristics of the acoustic wave elements 4.

In the high-frequency module 1b according to Modification 2, as in the high-frequency module 1 according to Preferred Embodiment 1, heat emitted from the first principal surfaces 21 of the semiconductor elements 2 to enter the first intermediate layer 6 to be directed to the side of the acoustic wave elements 4, of the heat generated by the semiconductor elements 2, can easily escape to the first insulating layer 3 through the second inner peripheral surface 342 of the first insulating layer 3. As a result, in the high-frequency module 1b according to Modification 2, heat conducted from the semiconductor elements 2 to the acoustic wave elements 4 is decreased, which makes it possible for the electrical characteristics of the acoustic wave elements 4 not to be easily deteriorated.

In the high-frequency module 1b according to Modification 2, further, a portion of heat generated by the semiconductor elements 2 is easily transferred from the metal portion 93 to the side of the second principal surface 32 of the first insulating layer 3. In FIG. 9, the transmission paths for heat from the metal portion 93 are schematically indicated by outlined arrows.

Preferred Embodiment 2

Figure 10:
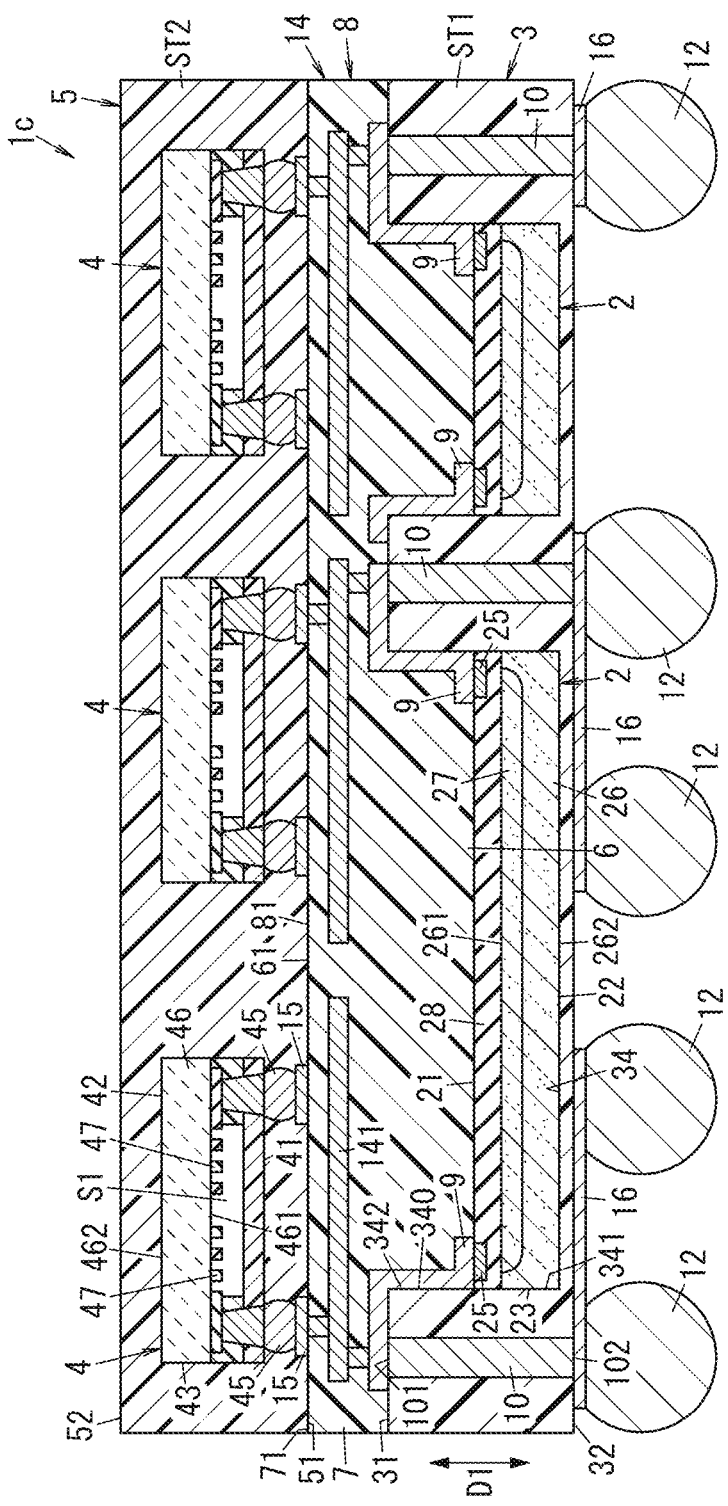
FIG. 10 is a sectional view of an electronic module according to Preferred Embodiment 2 of the present invention.

An electronic module (high-frequency module 1c) according to Preferred Embodiment 2 of the present invention will be described below with reference to FIG. 10.

The high-frequency module 1c according to Preferred Embodiment 2 differs from the high-frequency module 1 according to Preferred Embodiment 1 in that it further includes second metal wiring portions 16 separately from the metal wiring portions 9 (hereinafter also referred to as "first metal wiring portions 9"). Elements of the high-frequency module 1c according to Preferred Embodiment 2 that are the same or substantially the same as those of the high-frequency module 1 according to Preferred Embodiment 1 are denoted by the same reference numerals and description thereof is omitted.

The second metal wiring portions 16 are provided on the side of the second principal surface 32 of the first insulating layer 3, and electrically connected to the through electrodes 10. Thus, the second metal wiring portions 16 are electrically connected to the first metal wiring portions 9 via the through electrodes 10. The second metal wiring portions 16 extend over the second principal surface 32 of the first insulating layer 3 and the second end surfaces 102 of the through electrodes 10.

The high-frequency module 1c according to Preferred Embodiment 2 includes the plurality of second metal wiring portions 16 in place of the plurality of terminal electrodes 11 in the high-frequency module 1 according to Preferred Embodiment 1.

In the high-frequency module 1c according to Preferred Embodiment 2, the plurality of bumps 12 are disposed on corresponding ones of the plurality of second metal wiring portions 16. At least one of the plurality of bumps 12 overlaps the semiconductor elements 2 without overlapping the through electrodes 10 in plan view in the thickness direction D1 of the first insulating layer 3. The second metal wiring portions 16 define rewiring portions that make the positions of the through electrodes 10 and the positions of the bumps 12 different from each other in plan view in the thickness direction D1 of the first insulating layer 3.

In the high-frequency module 1c according to Preferred Embodiment 2, the second metal wiring portions 16 and the bumps 12 overlap the semiconductor elements 2 in the thickness direction D1 of the first insulating layer 3. Thus, it is further possible for heat generated by the semiconductor elements 2 not to be conducted easily to the acoustic wave elements 4. The advantageous effect of reducing or preventing a rise in the temperature of the acoustic wave elements 4 can be obtained if the second metal wiring portions 16 are provided on the side of the second principal surface 32 of the first insulating layer 3 and the second metal wiring portions 16 are electrically connected to the through electrodes 10, even if the second metal wiring portions 16 do not overlap the semiconductor elements 2 in plan view in the thickness direction D1. In the high-frequency module according to a modification of Preferred Embodiment 2, the high-frequency module 1c according to Preferred Embodiment 2 may further include a third insulating layer provided on the second principal surface 32 of the first insulating layer 3. In this modification, a portion of the third insulating layer is interposed between a portion of the second metal wiring portions 16 and the second principal surface 32 of the first insulating layer 3. The third insulating layer may be directly provided on the second principal surface 32 of the first insulating layer 3 and on the second principal surfaces 22 of the semiconductor elements 2. The material of the third insulating layer is a polyimide resin or the like, for example.

Preferred Embodiment 3

Figure 11:
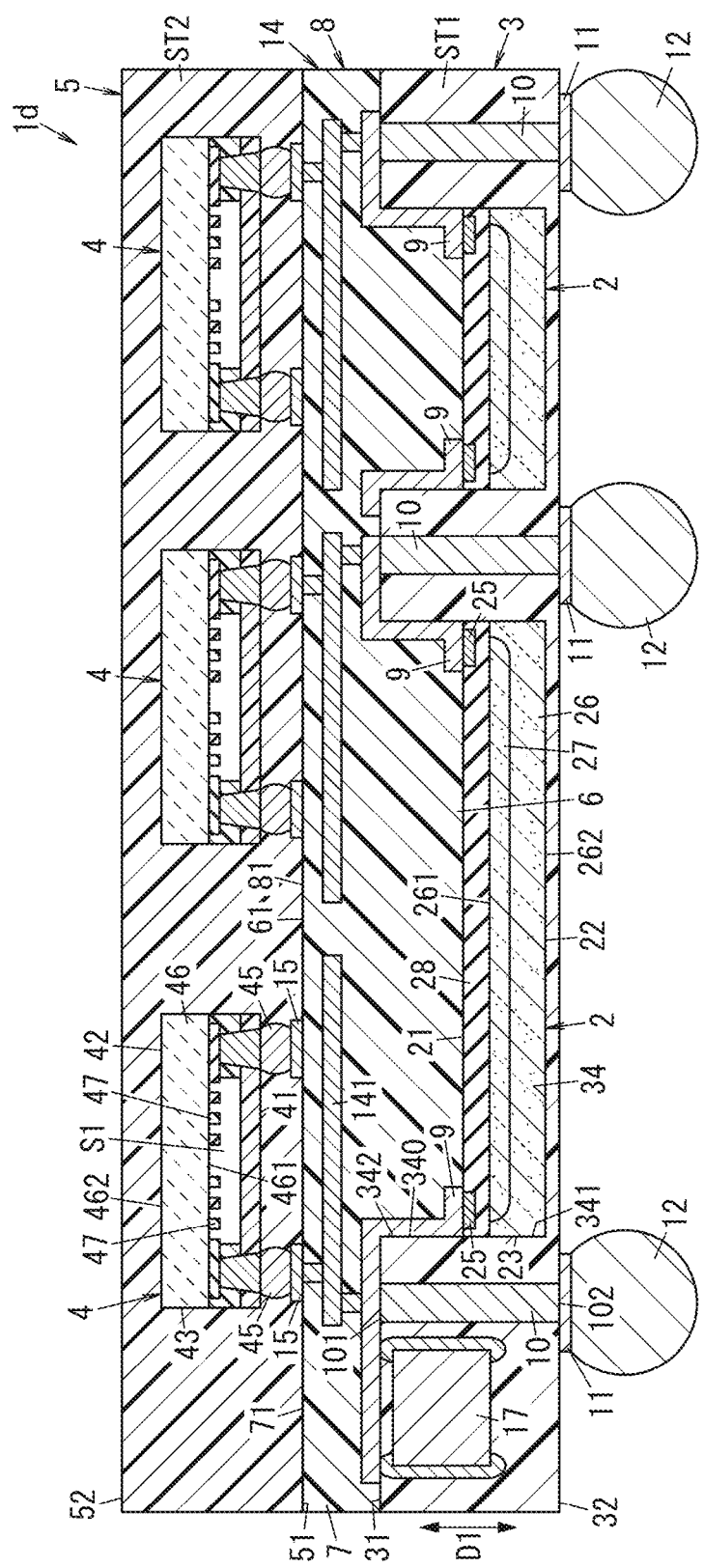
FIG. 11 is a sectional view of an electronic module according to Preferred Embodiment 3 of the present invention.

An electronic module (high-frequency module 1d) according to Preferred Embodiment 3 of the present invention will be described below with reference to FIG. 11.

The high-frequency module 1d according to Preferred Embodiment 3 differs from the high-frequency module 1 according to Preferred Embodiment 1 in that it further includes, in addition to the semiconductor elements 2, an electronic component 17 in the first insulating layer 3. Elements of the high-frequency module 1d according to Preferred Embodiment 3 that are the same or substantially the same as those of the high-frequency module 1 according to Preferred Embodiment 1 are denoted by the same reference numerals and description thereof is omitted.

The dimension of the electronic component 17 in the thickness direction D1 of the first insulating layer 3 is larger than the thickness of the semiconductor elements 2. The electronic component 17 is a passive element such as an inductor and a capacitor, for example.

In the high-frequency module 1d according to Preferred Embodiment 3, as in the high-frequency module 1 according to Preferred Embodiment 1, it is possible for heat generated by the semiconductor elements 2 not to be conducted easily to the acoustic wave elements 4, which makes it possible to reduce or prevent deterioration in the electrical characteristics of the acoustic wave elements 4.

In the high-frequency module 1d according to Preferred Embodiment 3, the electronic component 17, the thickness of which is larger than the thickness of the semiconductor elements 2, is disposed in the first insulating layer 3 between the second principal surface 32 and the first principal surface 31 of the first insulating layer 3, the distance L1 (see FIG. 3) between which is greater than the distance L2 (see FIG. 3) between the second principal surface 32 of the first insulating layer 3 and the one principal surface 21 of the semiconductor element 2. Therefore, the height of the high-frequency module 1d can be reduced compared to a case where the electronic component 17 is disposed when there is no step in the first insulating layer 3.

Preferred Embodiments 1 to 3 described above are each merely ones of various preferred embodiments of the present invention. Preferred Embodiments 1 to 3 can be modified in various ways in accordance with the design and the like as long as the object of the present invention can be achieved.

For example, the number of the semiconductor elements 2 is not limited to two or more, and there may be only one semiconductor element 2. The number of the acoustic wave elements 4 is not limited to two or more, and there may be only one acoustic wave element 4.

The first intermediate layer 6, of the intermediate layer 8 which includes the first intermediate layer 6 and the second intermediate layer 7, may be a gas layer, for example. In the high-frequency module 1, at least a portion of the outer periphery of the second intermediate layer 7 may be positioned on the inner side with respect to at least one of the outer periphery of the first insulating layer 3 and the outer periphery of the second insulating layer 5 in plan view in the thickness direction D1 of the first insulating layer 3.

The first insulating layer 3 includes the recessed portions 34 which accommodate the semiconductor elements 2. However, the first insulating layer 3 may include through holes that accommodate the semiconductor elements 2 in place of the recessed portions 34. In this case, the first insulating layer 3 only covers the outer peripheral surface 23 of each of the semiconductor elements 2, of the first principal surface 21, the second principal surface 22, and the outer peripheral surface 23 of the semiconductor element 2. The inner peripheral surface of each of the through holes in the first insulating layer 3 includes a first inner peripheral surface that is in contact with the outer peripheral surface 23 of the semiconductor element 2 and a second inner peripheral surface located farther away from the second principal surface 32 of the first insulating layer 3 than the first inner peripheral surface.

The acoustic wave filter which defines the acoustic wave element 4 is not limited to a SAW filter which uses a surface acoustic wave, and may be an acoustic wave filter that uses a boundary acoustic wave, a plate wave, or the like, for example. The structure of the acoustic wave element 4 is not limited to that in the example in FIG. 1. For example, the acoustic wave element 4 may be a SAW filter structured differently from that in FIG. 1.

The acoustic wave element 4 may be a BAW (Bulk Acoustic Wave) filter that uses a bulk acoustic wave, for example. The BAW filter includes a substrate and a plurality of BAW resonators. The BAW resonators each include a first electrode, a piezoelectric body film, and a second electrode. The first electrode is formed on the substrate. The piezoelectric body film is provided on the first electrode. The second electrode is provided on the piezoelectric body film.

The substrate in the BAW filter includes a silicon substrate and an electrical insulating film formed on the silicon substrate, for example. The electrical insulating film is a silicon oxide film, for example. The piezoelectric body film is made of lead zirconate titanate (PZT), for example.

The substrate of the BAW filter includes a cavity on the side of the first electrode opposite from the side of the piezoelectric body film. The BAW resonators are FBARs (Film Bulk Acoustic Resonators). In the case where the acoustic wave element 4 is a BAW filter, each of the plurality of BAW resonators define a functional portion. The BAW resonators are not limited to FBARs, and may be SMRs (Solidly Mounted Resonators), for example.

The semiconductor element 2 is not limited to an active element, and may be a switch IC (Integrated Circuit) that includes a plurality of semiconductor switches, for example. The semiconductor switches may be FETs (Field Effect Transistors), for example.

The high-frequency module 1 does not necessarily include the through electrodes 10, the terminal electrodes 11, and the bumps 12. In this case, a portion of the metal wiring portions 9 that extends onto the first principal surface 31 of the first insulating layer 3 may be exposed without being covered by the second insulating layer 5, for example. In this case, in addition, the method of manufacturing the high-frequency module 1 does not need to include the second step (see FIG. 4B) of forming a photoresist layer 115, the third step (see FIG. 4C) of forming conductor pillars 100, the fourth step (see FIG. 4D) of removing the photoresist layer 115, the thirteenth step (see FIG. 7A) of polishing the first insulating layer 3, and the fourteenth step (see FIG. 7B) of forming terminal electrodes 11 and bumps 12 discussed above.

In the support member preparation step of the method of manufacturing the high-frequency module 1, the conductive layer 113 is indirectly provided above the support body 111. However, the present invention is not limited thereto, and the conductive layer 113 may be directly provided on the support body 111.

As seen from Preferred Embodiments 1 to 3 and so on described above, the following aspects are disclosed herein.

An electronic module (high-frequency module 1; 1a; 1b; 1c; 1d) according to a preferred embodiment of the present invention includes a semiconductor element (2), a first insulating layer (3), an electronic element (acoustic wave element 4), and a second insulating layer (5). The first insulating layer (3) covers at least an outer peripheral surface (23) of the semiconductor element (2). The first insulating layer (3) includes a first principal surface (31) and a second principal surface (32) that face each other. The electronic element (acoustic wave element 4) is electrically connected to the semiconductor element (2). The electronic element (acoustic wave element 4) has electrical characteristics. The second insulating layer (5) covers at least an outer peripheral surface (43) of the electronic element (acoustic wave element 4). In the electronic module (high-frequency module 1; 1a; 1b; 1c; 1d), at least a portion of the electronic element (acoustic wave element 4) and at least a portion of the semiconductor element (2) overlap each other in plan view in a thickness direction (D1) of the first insulating layer (3). The electronic module (high-frequency module 1; 1a; 1b; 1c; 1d) further includes a first intermediate layer (6; 6a) and a second intermediate layer (7). The first intermediate layer (6; 6a) is interposed between the electronic element (acoustic wave element 4) and the semiconductor element (2). The first intermediate layer (6; 6a) has a thermal conductivity that is lower than a thermal conductivity of the first insulating layer (3) and a thermal conductivity of the second insulating layer (5). The second intermediate layer (7) is interposed between the first insulating layer (3) and the second insulating layer (5). The second intermediate layer (7) has a thermal conductivity that is lower than the thermal conductivity of the first insulating layer (3) and the thermal conductivity of the second insulating layer (5). In the electronic module (high-frequency module 1; 1a; 1b; 1c; 1d), a step is provided between the first principal surface (31) of the first insulating layer (3), which is in contact with the second intermediate layer (7), and one principal surface (21) of the semiconductor element (2), which is in contact with the first intermediate layer (6; 6a). In the electronic module (high-frequency module 1; 1a; 1b; 1c; 1d), a distance (L1) between the second principal surface (32) and the first principal surface (31) of the first insulating layer (3) is greater, in the thickness direction (D1), than a distance (L2) between the second principal surface (32) of the first insulating layer (3) and the one principal surface (21) of the semiconductor element (2).

With the electronic module (high-frequency module 1; 1a; 1b; 1c; 1d) described above, it is possible to reduce or prevent deterioration in the electrical characteristics of the electronic element (acoustic wave element 4).

In an electronic module (high-frequency module 1; 1a; 1b; 1c; 1d) according to a preferred embodiment of the present invention, the first insulating layer (6; 6a) includes a resin. A minimum distance (L6) between the one principal surface (21) of the semiconductor element (2) and a principal surface (61; 61a) of the first intermediate layer (6; 6a) on a side of the electronic element (acoustic wave element 4) is greater than a minimum distance (L7) between the first principal surface (31) of the first insulating layer (3) and a principal surface (71) of the second intermediate layer (7) on a side of the acoustic wave element (4).

With the electronic module (high-frequency module 1; 1a; 1b; 1c; 1d) described above, it is possible to reduce or prevent deterioration in the electrical characteristics of the electronic element (acoustic wave element 4) irrespective of the shape of the principal surface (61; 61a) of the first intermediate layer (6; 6a) on the side of the electronic element (acoustic wave element 4).

An electronic module (high-frequency module 1; 1a; 1b; 1c; 1d) according to a preferred embodiment of the present invention further includes a metal wiring portion (9). The metal wiring portion (9) is electrically connected to the semiconductor element (2). The first insulating layer (3) includes a recessed portion (34) that accommodates the semiconductor element (2). An inner peripheral surface (340) of the recessed portion (34) of the first insulating layer (3) includes a first inner peripheral surface (341) that is in contact with the outer peripheral surface (23) of the semiconductor element (2) and a second inner peripheral surface (342) located farther away from the second principal surface (32) of the first insulating layer (3) than the first inner peripheral surface (341). The metal wiring portion (9) extends on the second inner peripheral surface (342) of the first insulating layer (3) on a side of the one principal surface (21) of the semiconductor element (2).

With the electronic module (high-frequency module 1; 1a; 1b; 1c; 1d) described above, heat generated by the semiconductor element (2) is easily transferred to the metal wiring portion (9), it is possible for the heat not to be easily conducted to the electronic element (acoustic wave element 4), and it is possible to further reduce or prevent deterioration in the electrical characteristics of the electronic element (acoustic wave element 4).

In an electronic module (high-frequency module 1; 1a; 1b; 1c; 1d) according to a preferred embodiment of the present invention, the metal wiring portion (9) extends onto the first principal surface (31) of the first insulating layer (3).

With the electronic module (high-frequency module 1; 1a; 1b; 1c; 1d) described above, it is possible for heat generated by the semiconductor element (2) not to be easily conducted to the electronic element (acoustic wave element 4), and it is possible to further reduce or prevent deterioration in the electrical characteristics of the electronic element (acoustic wave element 4).

An electronic module (high-frequency module 1; 1a; 1b; 1c; 1d) according to a preferred embodiment of the present invention further includes a through electrode. The through electrode (10) is electrically connected to the metal wiring portion (9). The through electrode (10) passes through the first insulating layer (3).

With the electronic module (high-frequency module 1; 1a; 1b; 1c; 1d) described, it is further possible for heat generated by the semiconductor element (2) not to be easily conducted to the electronic element (acoustic wave element 4), and it is possible to further reduce or prevent deterioration in the electrical characteristics of the electronic element (acoustic wave element 4).

An electronic module (high-frequency module 1c) according to a preferred embodiment of the present invention further includes a second metal wiring portion (16), separately from a first metal wiring portion that defines and functions as the metal wiring portion (9). The second metal wiring portion (16) is provided on a side of the second principal surface (32) of the first insulating layer (3), and electrically connected to the through electrode (10).

With the electronic module (high-frequency module 1c) described above, it is further possible for heat generated by the semiconductor element (2) not to be easily conducted to the electronic element (acoustic wave element 4), and it is possible to further reduce or prevent deterioration in the electrical characteristics of the electronic element (acoustic wave element 4).

In an electronic module (high-frequency module 1; 1a; 1b; 1c; 1d) according to a preferred embodiment of the present invention, the semiconductor element (2) includes a functional portion (27). The one principal surface (21) of the semiconductor element (2) is a surface on a side on which the functional portion (27) is formed.

With the electronic module (high-frequency module 1; 1a; 1b; 1c; 1d) described above, it is possible for heat generated by the semiconductor element (2) not to be easily conducted to the electronic element (acoustic wave element 4), and it is possible to reduce or prevent deterioration in the electrical characteristics of the electronic element (acoustic wave element 4), while reducing the distance between the functional portion (27) of the semiconductor element (2) and the electronic element (acoustic wave element 4).

In an electronic module (high-frequency module 1; 1a; 1b; 1c; 1d) according to a preferred embodiment of the present invention the electronic element (acoustic wave element 4) includes a functional portion (IDT electrode 47). The functional portion of the electronic element (acoustic wave element 4) is directed toward the semiconductor element (2).

With the electronic module (high-frequency module 1; 1a; 1b; 1c; 1d) described, it is possible for heat generated by the semiconductor element (2) not to be easily conducted to the functional portion of the electronic element (acoustic wave element 4), and it is possible to reduce or prevent deterioration in the electrical characteristics of the electronic element (acoustic wave element 4), while reducing the distance between the semiconductor element (2) and the functional portion of the electronic element (acoustic wave element 4).

In an electronic module (high-frequency module 1; 1a; 1b; 1c; 1d) according to a preferred embodiment of the present invention, the first insulating layer (3) is a resin layer that includes a filler.

With the electronic module (high-frequency module 1; 1a; 1b; 1c; 1d) described above, the thermal conductivity of the first insulating layer (3) can be increased, and heat generated by the semiconductor element (2) can easily escape, compared to a case where the first insulating layer (3) is a resin layer including no filler.

In an electronic module (high-frequency module 1; 1a; 1b; 1c; 1d) according to a preferred embodiment of the present invention, the first intermediate layer (6; 6a) and the second intermediate layer (7) are each a fillerless resin layer.

With the electronic module (high-frequency module 1; 1a; 1b; 1c; 1d) described above, the thermal conductivity of the first intermediate layer (6; 6a) and the thermal conductivity of the second intermediate layer (7) can be reduced, and it is possible for heat generated by the semiconductor element (2) not to be easily conducted to the side of the electronic element (acoustic wave element 4), compared to a case where the first intermediate layer (6; 6a) and the second intermediate layer (7) are each a resin layer that includes a filler.

A method of manufacturing an electronic module according to a preferred embodiment of the present invention includes a temporary fixing material formation step, a semiconductor element arrangement step, a first insulating layer formation step, a removal step, an intermediate layer formation step, an electronic element arrangement step, and a second insulating layer formation step. In the temporary fixing material formation step, a temporary fixing material (120) is formed on one principal surface (114) of a support member (110), a size of the temporary fixing material (120) in plan view being smaller than that of the one principal surface (114) in plan view. In the semiconductor element arrangement step, a semiconductor element (2) is disposed on the temporary fixing material (120) with one principal surface (21) of the semiconductor element (2) facing to the temporary fixing material (120). In the first insulating layer formation step, a first insulating layer (3) is formed on a side of the one principal surface (114) of the support member (110), the first insulating layer (3) covering at least an outer peripheral surface (23) of the semiconductor element (2). The first insulating layer (3) includes a first principal surface (31) on a side of the one principal surface (114) of the support member (110) and a second principal surface (32) that faces the first principal surface (31). In the removal step, the support member (110) and the temporary fixing material (120) are removed after the first insulating layer formation step. In the intermediate layer formation step, a first intermediate layer (6; 6a) is formed on the one principal surface (21) of the semiconductor element (2) and a second intermediate layer (7) is formed on the first principal surface (31) of the first insulating layer (3) after the removal step. In the electronic element arrangement step, an electronic element (acoustic wave element 4) is disposed so as to overlap at least a portion of the first intermediate layer (6; 6a) and at least a portion of the semiconductor element (2) in a thickness direction of the semiconductor element (2) after the intermediate layer formation step, the electronic element having electrical characteristics and being electrically connected to the semiconductor element (2). In the second insulating layer formation step, a second insulating layer (5) that covers at least an outer peripheral surface (43) of the electronic element (acoustic wave element 4) is formed after the electronic element arrangement step. The temporary fixing material formation step includes forming the temporary fixing material (120) to have a size corresponding to the one principal surface (21) of the semiconductor element (2). The intermediate layer formation step includes forming both the first intermediate layer (6; 6a) and the second intermediate layer (7) using a material with a thermal conductivity that is lower than both a thermal conductivity of the first insulating layer (3) and a thermal conductivity of the second insulating layer (5).

With a method of manufacturing an electronic module according to a preferred embodiment described above, it is possible to reduce or prevent deterioration in the electrical characteristics of the electronic element (acoustic wave element 4).

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic module comprising:
   a semiconductor element;
   a first insulating layer covering at least an outer peripheral surface of the semiconductor element and including a first principal surface and a second principal surface that face each other;
   an electronic element electrically connected to the semiconductor element and having electrical characteristics;
   a second insulating layer covering at least an outer peripheral surface of the electronic element;
   at least a portion of the electronic element and at least a portion of the semiconductor element overlapping each other in plan view in a thickness direction of the first insulating layer;
   a first intermediate layer interposed between the electronic element and the semiconductor element and having a thermal conductivity lower than a thermal conductivity of the first insulating layer and a thermal conductivity of the second insulating layer; and
   a second intermediate layer interposed between the first insulating layer and the second insulating layer and having a thermal conductivity lower than the thermal conductivity of the first insulating layer and the thermal conductivity of the second insulating layer; wherein
   a step is provided between the first principal surface of the first insulating layer, which is in contact with the second intermediate layer, and one principal surface of the semiconductor element, which is in contact with the first intermediate layer, and a distance between the second principal surface and the first principal surface of the first insulating layer is greater, in the thickness direction, than a distance between the second principal surface of the first insulating layer and the one principal surface of the semiconductor element.

2. The electronic module according to claim 1, wherein the first intermediate layer includes a resin; and
   a minimum distance between the one principal surface of the semiconductor element and a principal surface of the first intermediate layer on a side of the electronic element is greater than a minimum distance between the first principal surface of the first insulating layer and a principal surface of the second intermediate layer on a side of the electronic element.

3. The electronic module according to claim 1, further comprising:
   a metal wiring portion electrically connected to the semiconductor element; wherein
   the first insulating layer includes a recessed portion that accommodates the semiconductor element;
   an inner peripheral surface of the recessed portion of the first insulating layer includes a first inner peripheral surface in contact with the outer peripheral surface of the semiconductor element and a second inner peripheral surface located farther away from the second principal surface of the first insulating layer than the first inner peripheral surface; and
   the metal wiring portion extends on the second inner peripheral surface of the first insulating layer on a side of the one principal surface of the semiconductor element.

4. The electronic module according to claim 3, wherein the metal wiring portion extends onto the first principal surface of the first insulating layer.

5. The electronic module according to claim 4, further comprising a through electrode electrically connected to the metal wiring portion and passing through the first insulating layer.

6. The electronic module according to claim 5, further comprising a second metal wiring portion on a side of the second principal surface of the first insulating layer, separate from a first metal wiring portion that defines and functions as the metal wiring portion, and electrically connected to the through electrode.

7. The electronic module according to claim 1, wherein the semiconductor element includes a functional portion; and
   the one principal surface of the semiconductor element is a surface on a side on which the functional portion is provided.

8. The electronic module according to claim 1, wherein the electronic element includes a functional portion that faces toward the semiconductor element.

9. The electronic module according to claim 1, wherein the first insulating layer is a resin layer that includes a filler.

10. The electronic module according to claim 1, wherein the first intermediate layer and the second intermediate layer are each a fillerless resin layer.

11. A method of manufacturing an electronic module, the method comprising:
   a temporary fixing material formation step of forming a temporary fixing material on one principal surface of a support, a size of the temporary fixing material in plan view being smaller than a size of the one principal surface in plan view;
   a semiconductor element arrangement step of disposing a semiconductor element on the temporary fixing material with one principal surface of the semiconductor element facing to the temporary fixing material;
   a first insulating layer formation step of forming a first insulating layer on a side of the one principal surface of the support, the first insulating layer covering at least an outer peripheral surface of the semiconductor element and including a first principal surface on a side of the one principal surface of the support and a second principal surface that faces the first principal surface;
   a removal step of removing the support and the temporary fixing material after the first insulating layer formation step;
   an intermediate layer formation step of forming a first intermediate layer on the one principal surface of the semiconductor element and a second intermediate layer on the first principal surface of the first insulating layer after the removal step;
   an electronic element arrangement step of disposing an electronic element so as to overlap at least a portion of the first intermediate layer and at least a portion of the semiconductor element in a thickness direction of the semiconductor element after the intermediate layer formation step, the electronic element having electrical characteristics and being electrically connected to the semiconductor element; and a second insulating layer formation step of forming a second insulating layer that covers at least an outer peripheral surface of the electronic element after the electronic element arrangement step; wherein the temporary fixing material formation step includes forming the temporary fixing material to have a size corresponding to the one principal surface of the semiconductor element; and the intermediate layer formation step includes forming both the first intermediate layer and the second intermediate layer by using a material with a thermal conductivity that is lower than both a thermal conductivity of the first insulating layer and a thermal conductivity of the second insulating layer.

12. The method of manufacturing an electronic module according to claim 11, wherein the first intermediate layer includes a resin; and a minimum distance between the one principal surface of the semiconductor element and a principal surface of the first intermediate layer on a side of the electronic element is greater than a minimum distance between the first principal surface of the first insulating layer and a principal surface of the second intermediate layer on a side of the electronic element.

13. The method of manufacturing an electronic module according to claim 11, further comprising:

electrically connecting a metal wiring portion to the semiconductor element; wherein the first insulating layer includes a recessed portion that accommodates the semiconductor element;

an inner peripheral surface of the recessed portion of the first insulating layer includes a first inner peripheral surface in contact with the outer peripheral surface of the semiconductor element and a second inner peripheral surface located farther away from the second principal surface of the first insulating layer than the first inner peripheral surface; and the metal wiring portion extends on the second inner peripheral surface of the first insulating layer on a side of the one principal surface of the semiconductor element.

14. The method of manufacturing an electronic module according to claim 13, wherein the metal wiring portion extends onto the first principal surface of the first insulating layer.

15. The method of manufacturing an electronic module according to claim 11, further comprising electrically connecting a through electrode to the metal wiring portion and passing through the first insulating layer.

16. The electronic module according to claim 5, further comprising forming a second metal wiring portion on a side of the second principal surface of the first insulating layer, separately from a first metal wiring portion that defines and functions as the metal wiring portion, and electrically connecting the second metal wiring portion the through electrode.

17. The method of manufacturing an electronic module according to claim 11, wherein the semiconductor element includes a functional portion; and the one principal surface of the semiconductor element is a surface on a side on which the functional portion is provided.

18. The method of manufacturing an electronic module according to claim 11, wherein the electronic element includes a functional portion that faces toward the semiconductor element.

19. The method of manufacturing an electronic module according to claim 11, wherein the first insulating layer is a resin layer that includes a filler.

20. The method of manufacturing an electronic module according to claim 11, wherein the first intermediate layer and the second intermediate layer are each a fillerless resin layer.

* * * * *